US006866886B2

(12) United States Patent
Knowles et al.

(10) Patent No.: US 6,866,886 B2
(45) Date of Patent: Mar. 15, 2005

(54) METHOD OF COATING THE INTERIOR SURFACE OF HOLLOW OBJECTS WITH A DIFFUSION COATING

(75) Inventors: Shawn D. Knowles, Saint Francis, MN (US); David J. Senor, West Richland, WA (US); Steven V. Forbes, Burbank, WA (US); Roger N. Johnson, Richland, WA (US); Glenn W. Hollenberg, Kennewick, WA (US)

(73) Assignee: Battelle Memorial Institute, Richland, WA (US)

( * ) Notice: Subject to any disclaimer, the term of this patent is extended or adjusted under 35 U.S.C. 154(b) by 174 days.

(21) Appl. No.: 10/406,766

(22) Filed: Apr. 2, 2003

(65) Prior Publication Data

US 2004/0197471 A1 Oct. 7, 2004

(51) Int. Cl.$^7$ ................................................. B05D 7/22

(52) U.S. Cl. ....................... 427/237; 427/238; 427/239; 118/DIG. 10; 118/DIG. 13

(58) Field of Search ................................ 427/545, 546, 427/585, 587, 588, 589, 590, 592, 593, 230, 237, 238, 239, 250, 372; 118/DIG. 10, DIG. 13

(56) References Cited

U.S. PATENT DOCUMENTS 3,804,059 A * 4/1974 Streel .......................... 118/726

* cited by examiner

Primary Examiner—Shrive P. Beck
Assistant Examiner—William Phillip Fletcher, III
(74) Attorney, Agent, or Firm—Douglas E. McKinley, Jr.

(57) ABSTRACT

A method for forming a diffusion coating on the interior of surface of a hollow object wherein a filament, extending through a hollow object and adjacent to the interior surface of the object, is provided, with a coating material, in a vacuum. An electrical current is then applied to the filament to resistively heat the filament to a temperature sufficient to transfer the coating material from the filament to the interior surface of the object. The filament is electrically isolated from the object while the filament is being resistively heated. Preferably, the filament is provided as a tungsten filament or molybdenum filament. Preferably, the coating materials are selected from the group consisting of Ag, Al, As, Au, Ba, Be, Bi, Ca, Cd, Co, Cr, Cu, Dy, Er, Eu, Fe, Ga, Ge, Hg, In, K, Li, Mg, Mn, Na, Ni P, Pb, Pd, Pr, S, Sb, Sc, Se, Si, Sn, Sr, Te, Tl, Y, Yb, Zn, and combinations thereof. The invention additionally allows for the formation of nitrides, hydrides, or carbides of all the possible coating materials, where such compounds exist, by providing a partial pressure of nitrogen, hydrogen, hydrocarbons, or combination thereof, within the vacuum.

40 Claims, 19 Drawing Sheets

METHOD OF COATING THE INTERIOR SURFACE OF HOLLOW OBJECTS WITH A DIFFUSION COATING

STATEMENT REGARDING FEDERALLY SPONSORED RESEARCH OR DEVELOPMENT

This invention was made with Government support under Contract DE-AC0676RLO 1830 awarded by the U.S. Department of Energy. The Government has certain rights in the invention.

BACKGROUND OF THE INVENTION

Physical vapor deposition (PVD) processes involve the formation of a coating on a substrate by physical deposition of atoms, ions, or molecules of the coating species. Traditionally, three main techniques for applying PVD coatings have been primarily used by industry: thermal evaporation, sputtering, and ion implanting. Thermal evaporation involves heating of the material until it forms a vapor that condenses on a substrate to form a coating. Sputtering involves the electrical generation of plasma between the coating species and the substrate. Ion implantation is essentially a combination of these two processes. Common features of all three techniques include the need for high vacuum and high power requirements.

Traditional PVD processes produce coatings for a range of applications including electronics, optics, decoration, and corrosion and wear resistance. These PVD coatings can be pure metals, alloys (via co-deposition), or compounds (via co-deposition or reactive deposition in a gaseous environment). Traditional PVD coatings are characteristically thin (up to a few $\mu$m), and are deposited at relatively low rates (1–10 nm/s). Most processes are operated on a batch basis, and the component size is limited by the size of the vacuum chamber. Provided that the substrate can be manipulated to face the coating source, the size and shape of objects to be coated are limited by the capital and operating expenditures involved rather than by the fundamental characteristics of the process.

In thermal evaporation, vapors are produced from a material located in a source that is heated by various methods such as resistance, induction, arc, electron beam, or laser. The substrate is located at an appropriate distance facing the evaporation source and the gas atoms condense on the relatively cold substrate surface. Thermal evaporation is typically conducted in vacuums of between $10^{-9}$ to $10^{-5}$ torr and under conditions where an atom evaporating from the source material travels in a straight line. Therefore, the process is line-of-sight limited, and coating around corners or angles is not possible without substrate manipulation.

Due to these drawbacks, traditional processes are generally unsuitable for providing coatings on the interior of hollow objects, such as pipes, in a cost effective and simplified manner. At the same time, a variety of industrial products stand to benefit from cost effective coating techniques that could apply coatings to the interior of hollow objects.

For example, new EPA regulations were placed into effect in October of 2002 governing diesel engine emissions. These regulations compel engine manufacturers to install exhaust gas recirculators (EGRs) on all their heavy-duty diesel engines. To minimize the weight of these systems, it is desirable to fabricate EGRs primarily from Al alloys. Unfortunately, sulfuric and nitric acid present in the exhaust gas can cause significant corrosion within aluminum tubing. Fe-rich iron aluminides coating on the interior these tubes could significantly reduce the corrosion due to their superb oxidation and sulfidation resistance.

Another example is the need for alternatives to Cr electroplating for wear- and corrosion-resistant coatings on the inner surface of medium-caliber (5.56 mm to 45 mm) gun barrels, due to environmental and health issues associated with hexavalent Cr electroplating. Another example is related to furnace tubes used in ethylene production. During ethylene production, coke deposits are formed on the inner surfaces of the furnace tubes, reducing heat transfer and degrading production. The deposits are typically removed by heating in excess of 1000° C., which causes downtime for production as well as significant energy costs. In addition, high-temperature alloys are required for the tubes to avoid damage during the coke removal process. Presently, DOE-OIT is funding a handful of studies under the Industrial Materials of the Future program to evaluate a variety of solutions to the coking problem, including coking-resistant alloys, liners, coatings, and novel tube geometries. However, none of these approaches have yet provided a cost-effective solution to the problem. Recent work by Oak Ridge National Laboratory and others suggest that a Fe-rich iron aluminide coating on a less-expensive furnace tube alloy would offer significant improvement in coking resistance, thereby reducing or eliminating the need for downtime and high-temperature de-coking treatments. However, since the ethylene furnace tubes are often required to be up to 30 ft long, improved methods of providing Fe-rich iron aluminide coatings on the interior surfaces of these tubes are still required. Yet another example relates to the development of advanced coal-fired power generation systems such as pressurized fluid-bed combustion (PFBC) systems and integrated gasification combined cycles (IGCC) systems. These technologies can provide economical power generation with minimal environmental emissions and high efficiency. However, these advanced power generation projects require a hot gas filter to remove corrosive and erosive coal ash entrained in the combustion stream. These hot gas filters, or candle filters, must be cost-effective and able to withstand the effects of corrosion, elevated temperature, thermal shock, and temperature transients. Degradation of metallic filter elements (typically austenitic stainless steels) has been observed under oxidizing, sulfidizing, and/or carburizing conditions, and acts as a driving force for the development of alternate hot gas filter materials. Iron aluminides can be considered for such applications because of their excellent high-temperature corrosion resistance in a variety of sulfur-bearing environments relevant to coal-derived systems. Other alternatives include ceramic or advanced alloy filters. However, use of these materials entails other considerations such as difficulties in fabrication, strength, and thermal shock resistance. Many of these problems could be overcome by coating the interior surfaces of inexpensive metallic filters with an appropriate corrosion-resistant material such as Fe-rich iron aluminides or Ni-Cr-Al-Fe alloys.

These and other applications create a need for cost effective techniques and technologies that enable the formation of coatings on the interior surfaces of hollow objects. More generally, there exists a need for methods that allow the formation of tightly bonded diffusion coatings on the interior surfaces of hollow metallic objects, such as pipes and tubes.

BRIEF SUMMARY OF THE INVENTION

Accordingly, it is an object of the present invention to provide a cost effective and simple method for forming a diffusion coating on the interior surface of a hollow object.

It is a further object of the present invention to provide a method for forming a diffusion coating on the interior surface of a hollow object, such as a metallic pipe or tube. It is a further object of the present invention to provide a method for forming a diffusion coating on the interior surface of a metallic pipe or tube that is smaller than 0.75 inches in its interior diameter, or which is smaller than 6 inches in its interior diameter and which exhibits an aspect ratio of length to interior diameter of 2 to 1 or greater.

These and other objects of the present invention are accomplished by providing a filament extending through a hollow object and adjacent to the interior surface of the object In practice, the present invention will likely be applied most frequently to coating tubes and pipes, as a large variety of industrial products utilizing tubes and pipes will benefit from the cost effective method for coating the interior surfaces of the present invention. However, it should be understood that the present invention is not limited to tubes and pipes per se, and is broadly applicable to any hollow object having an interior surface. Accordingly, the shape of the hollow object need not by cylindrical, as is typical of tubes and pipes, and the present invention is equally capable of coating any hollow object regardless of the shape. Further, while standards bodies such as ANSI distinguish between "tubes" and "pipes" according to their size, as used herein, the term "pipe" is intended to be broadly construed as encompassing all such sizes and forms of generally cylindrical hollow objects. The present invention provides particular advantages over prior art methods in coating pipes having geometries that are inherently unsuitable for prior art methods. As such, the present invention provides particular advantages in coating the internal surfaces of pipes having an interior diameter of less than 0.75 inches, or an interior diameter of less than 6 inches and an aspect ratio of length to diameter greater than or equal to 2 to 1.

The filament is provided with a coating material. Generally, the filament may be any metal that can be heated to a sufficient temperature to sublimate or evaporate the coating materials without losing its structural integrity or undergoing detrimental reactions with the coating materials. Preferably, the filament is provided as a tungsten filament or molybdenum filament. Generally, the coating materials may be any metal(s) that can be heated to a sufficient temperature to sublimate or evaporate without undergoing detrimental reactions with the filament. Preferably, the coating materials are selected from the group consisting of Ag, Al, As, Au, Ba, Be, Bi, Ca, Cd, Co, Cr, Cu, Dy, Er, Eu, Fe, Ga, Ge, Hg, In, K, Li, Mg, Mn, Na, Ni, P, Pb, Pd, Pr, S, Sb, Sc, Se, Si, Sn, Sr, Te, Tl, Y, Yb, Zn, and combinations thereof. By way of example, but not meant to be limiting, a typical filament would consist of a tungsten wire with an aluminum coating material. Continuing the example, the filament and the coating materials may be provided as wires, with either a tungsten wire wrapped around a aluminum wire, or as a aluminum wire wrapped around a tungsten wire. Alternatively, the coating material may be provided as a coating or a cladding, either on or within the filament. Accordingly, as used herein, where a filament is described as "having a coating material" or as "having a coating material thereupon," it should be understood that these phrases merely mean that the filament and the coating material are provided in sufficiently close proximity to one and another such that when the filament is heated, the coating material will likewise be heated. The specific technique or configuration used to provide the filament and the coating material in close proximity will typically be selected according to the convenience of the user (e.g. wrapping the filament with a wire of the coating material, depositing the coating material via thermal spray or hot-dipping, or braiding a wire or rod of the coating material into the tungsten filament), and any method that results in a filament and a coating material in close proximity should be considered as falling within the scope of the present invention.

The filament, coating material, and hollow object are all maintained in a vacuum. One of the advantages of the present invention is that the vacuum pressure required to make the coatings of the present invention need not be as low as the vacuum pressure used in traditional PVD coating techniques. Whereas these prior art techniques typically require a vacuum of between $10^{-9}$ to $10^{-5}$ torr, the present invention has been shown to provide an effective coating at pressures better than $10^{-4}$ torr. The present invention also allows much higher deposition rates (exceeding 1 $\mu$m/s) and produces thicker coatings (up to 60 $\mu$m) than traditional PVD coatings. Because the substrate typically is heated during deposition using the present invention, interdiffusion of coating and substrate materials may be controlled to produce partial or complete conversion coatings, unlike traditional PVD techniques. Additionally, the present invention allows for the formation of nitrides, hydrides, or carbides of all the possible coating materials where such compounds exist. The formation of such compounds is accomplished by providing a partial pressure of nitrogen, hydrogen, hydrocarbons, or combinations thereof within the vacuum.

Once the filament, coating material, and hollow object are provided in a vacuum, an electrical current is the applied to the filament, to resistively heat the filament to a temperature sufficient to transfer the coating material from the filament to the interior surface of the object The electrical current is provided by connecting a power supply to the filament to create a current therethrough. Transfer of the coating material may occur either by evaporation, sublimation, or some combination of the two processes. Preferably, the filament is heated in a manner that allows the coating material to evaporate or sublimate in an atomic form, thereby forming an evenly distributed coating on the interior surface of the object. To prevent arcing from the resistively heated filament to the hollow object, it is important to maintain the hollow object as electrically isolated from the filament. This is accomplished first by insuring no electrical pathway, such as a common ground, exists between the filament and the hollow object.

As will be recognized by those having skill in the art, as the filament and the hollow object are heated, they will tend to experience thermal expansion, often at different rates. Differing rates of expansion create the potential that the alignment between the filament and interior surface of the hollow object may be altered during the coating process, and may potentially come into contact, thereby resulting in a loss of physical isolation. The present invention contemplates two strategies for preventing the loss of alignment between the filament and the interior surface of the hollow object. In the first strategy, tension is applied to the filament. For example, by attaching one end of the filament to a tensioning device, such as a spring, as the filament expands, the tensioning device will contract to take up any slack in the filament. In a second strategy, non-conducting guides are place in between the filament and the hollow object, for example at either end of the hollow object. Such guides may be fabricated of ceramic materials, thus maintaining the alignment of the filament with the hollow object without establishing an electrical pathway between the two. Also contemplated by the present invention is the use of the tensioning devices and guides in tandem to maintain proper alignment between the filament and the hollow object during the coating process.

As will be recognized by those having skill in the art, when deposited in this manner, the coating material will form a diffusion coating formed of the object and the coating material on the interior surface of the object, provided the internal surface of the hollow object is maintained at the correct temperature. As is typical in the formation of diffusion coatings generally, the coating thus formed will typically display a diffusion layer at the surface of the interior surface of the object wherein the coating material is diffused into the interior surface of the hollow object. As is typical of diffusion coatings, the relative concentration of the coating material generally increases towards the surface of the coating. Accordingly, the heating may be controlled to form a diffusion layer of any depth desired. At one end of the spectrum, the heating is controlled such that the diffusion layer transitions to a pure layer of the coating material at the surface of the coated object. At the other end of the spectrum, the heating may be controlled such that the entire coating is a substantially homogeneous diffusion layer formed of a mixture of the hollow object and the coating material. The present invention allows careful control of the temperatures both at the surface of the hollow object and at the heated filament, thereby allowing the formation of any diffusion layer along the spectrum as desired by the user. The specific heating profile for both the filament and the hollow object for any given diffusion layer will of course depend on the specific materials of which the hollow object is made and the specific materials used for the coating materials. As the present invention contemplates a wide range of materials for both the hollow object and the coating material, it is not possible to generalize a specific heating profile that will encompass the full range of possible diffusion coatings that may be successfully created by the method of the present invention. However, the formation of diffusion layers using the various materials are generally well characterized, and those having skill in the art will readily be able to ascertain the desired heating profile after selecting any specific combination of materials for the hollow object, the coating materials, and the diffusion layer desired.

Generally, the hollow object will be heated by radiant heating from the filament. In many cases, this radiant heating will be sufficient to form the desired diffusion layer. In other circumstances, additional heating may be necessary. Such heat may be supplied by resistively heating the hollow object itself. In such a circumstance, a power supply is connected to the hollow object to provide a current through the hollow object, thereby allowing precise control over the temperature of the hollow object. As with the hollow object itself, it is important that the power source connected to the hollow object be maintained as electrically isolated from the filament, and from the power source providing current to the filament.

DETAILED DESCRIPTION OF THE INVENTION

Figure 1:
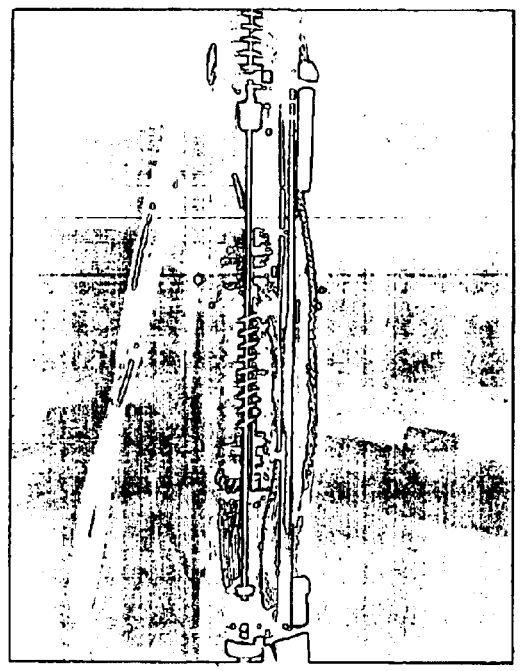
FIG. 1. is a photograph of the vacuum chamber and fixturing used for coating 14-in. long tubes in an experiment to demonstrate the present invention.

A series of experiments were conducted to demonstrate the method of the present invention. While these experiments demonstrated the suitability of the present invention for producing aluminide coatings on three hollow objects (or substrates) in four separate sizes, the present invention should in no way be limited to the specific coating materials, substrates, substrate sizes shown. Rather, these experiments should be considered as merely exemplary of the capabilities of the present invention, and the present invention should be understood to broadly encompass the full range of coating materials, filaments, hollow objects, and sizes, as set forth above in the summary of the invention.

Substrates for these experiments included 0.375-in. diameter 4130 steel and type 316 stainless steel tubes, and 1.5-in. and 2.0-in. diameter Al-alloy 6061 tubes. Coating/substrate systems included Al on 4130 and 316SS, Ni and Fe on 6061, and co-deposited Al and Fe on 6061. These experiments demonstrated the ability of the present invention to produce aluminide coatings that could be used for a variety of applications including, but not limited to, heavy-duty diesel engine fuel injector nozzles, hydraulic fluid tubing, Al-alloy engine cylinder linings, fossil fuel power plant hot gas filters, and exhaust gas recirculator heat exchangers.

Control of aluminide coating thickness on 4130 and 316SS was demonstrated over a range from 2–60 µm, and control of the coating composition was demonstrated over a range of 50–100 w/o Al. Aluminide coatings on 4130 exhibited hardness values in excess of 800 $H_K$, and the coatings exhibited a porus layer of Al-rich material on the surface that could be beneficial for post-process machining and lubricant retention. Aluminide coatings on 316SS tubes exhibited hardnesses up to 767 $H_K$, and they exhibited a dense microstructure potentially beneficial for erosion or corrosion resistance. The iron- and nickel-aluminide coatings produced on the inner surface of 6061 tubes ranged in thickness from 4–10 µm. These coatings were well-bonded, smooth, and of uniform thickness. These coatings produced multi-layer microstructures consisting of isolated or mixed Fe- and Ni-rich aluminides. Overall, the results of the experiments demonstrated the versatility of the present invention with regard to coating materials, substrate materials, substrate geometry, coating thickness, coating composition, and coating microstructure.

In addition to the experiments described herein, the method of the present invention was used to produce aluminide coatings on the inner surface of stainless steel tubes as small as 0.34-in. inner diameter and up to 158 in. long, and Ni coatings on Zr-base alloy tubes with 0.27-in. inner diameter and 14 in. long as shown in Table 1.

TABLE 1

| Coating Material | Substrate Material | Inside Diameter (in) | Length (in) |
| --- | --- | --- | --- |
| Al | 316 stainless steel | 0.34 | 158 |
|  | 4130 alloy steel | 0.38 | 2 |
| Al + Fe | 6061 aluminum | 1.5 | 2 |
| Al-6% Si | 316 stainless steel | 0.34 | 24 |
| Fe | 6061 aluminum | 2.0 | 2 |
| Ni | 6061 aluminum | 2.0 | 2 |
|  | Zircaloy-4 | 0.27 | 14 |

In these examples, the source coating material was incorporated into a tungsten wire filament placed in the center of the tube to provide an electrical path for resistive heating, thereby melting and subsequently evaporating the coating material. The coating process is line-of-sight and approximately 97% efficient with complete coverage of the tube interior surface. Uniformity of the coating is related to the uniformity of radiant heating of the tube by the filament. The radiant heating also allows rapid interdiffusion of coating and substrate materials, creating a true metallurgical bond. Coating composition can be varied by adjusting process times and temperatures, and coating thickness is controlled by the amount of source material incorporated in the tungsten filament. Coating process times are short, typically requiring only a few minutes, and no hazardous feed materials or effluents are needed. The coating process normally is conducted in vacuum of better than $10^{-4}$ torr. For short tubes (less than 6 ft long), the method of the present invention usually is conducted in a vertical orientation. For longer tubes, a horizontal orientation is preferred. The tube and filament are held in a strongback with appropriate ceramic guides to provide electrical isolation between the tube and filament. The ceramic guides allow independent thermal expansion of the filament and tube and therefore maintain alignment as well as electrical isolation throughout the coating process. FIG. 1 shows a typical arrangement for the ceramic guides on a 14-in. long tube.

Figure 2:
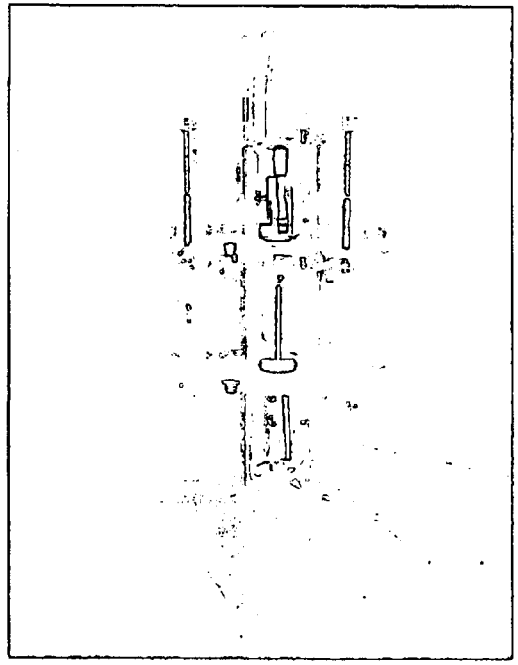
FIG. 2. is a photograph of the fixturing arrangement for the 0.375-in. diameter 4130 and 316SS tubes used in an experiment to demonstrate the present invention.

For the present study, only short tubes were of interest to demonstrate the desired coating characteristics. Therefore, a length of 2 in. was selected for both the 0.375-in. diameter 4130 and 316SS tubes, and the 1.5-in. and 2.0-in. diameter 6061 tubes. To produce repeatable results, a common set of guides were developed for the 0.375-in. tubes and filaments. Coating was performed with the filament and tube in a vertical orientation. The tube was held in place and aligned vertically by ceramic bushings seated in stainless steel plates. The plates were attached to a stainless steel frame that allowed the tubes to be raised or lowered as needed. The filament was suspended in the center of the tube, using ceramic guides at the top and bottom to maintain alignment with, and electrical isolation from, the tube. The filaments were connected to the power supply leads at top and bottom with semi-rigid copper tubing anchored to the same frame that held the tube support plates. FIG. 2 shows a typcial arrangement for the 0.375-in. tubes and filaments. The fixturing for the 2.0-in. tubes was somewhat simpler due to the increased clearance between the filament and the substrate, but an arrangement comparable to the one shown in FIG. 2 was used. Radiant heating from the filament was adequate to heat the 0.375-in. tubes to the desired temperature during coating, but resistive heating was needed to provide adequate heating with the larger 6061 tubes. Small holes were drilled and tapped on opposite sides of the tubes, to which the electrical leads were attached. Alternatively, the larger tubes were heated by passing current through Cu plates in contact with the ends of the tube.

Figure 3:
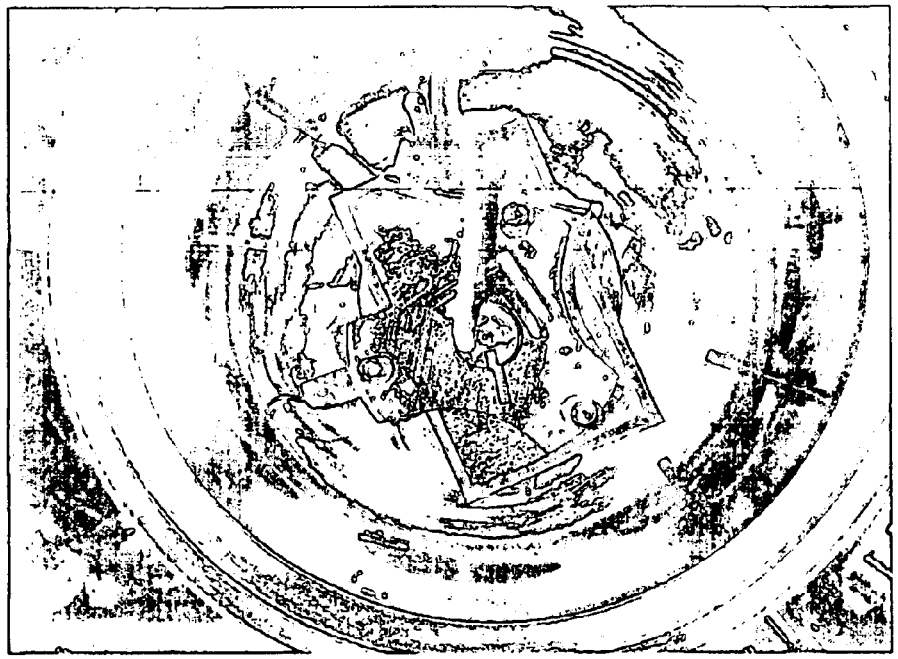
FIG. 3. is a photograph of the vacuum chamber used in an experiment to demonstrate the present invention with 0.375-in. tube fixturing installed prior to coating.

Because the tubes were only 2 in. long in the present study, the long vertical coating chamber shown in FIG. 1 was not necessary. A relatively large vacuum chamber (interior dimensions roughly 12 in. diameter and 12 in. tall) was modified for use instead. All existing internal fixtures were removed, and four electrical feedthroughs were installed to supply power to the filaments and the 6061 tubes. The modified vacuum chamber provided ample room for fixturing and wiring and proved a very flexible experimental apparatus. A diffusion pump backed by a centrifugal pump provided better than $10^{-4}$ torr vacuum for coating. The vacuum chamber is shown in FIG. 3 with a representative set of fixtures inside.

Power to the filament typically was provided by a Sorensen DCR-40-70B DC power supply, with 80 A maximum output. To provide substrate heating with the 1.5-in. and 2-in. 6061 tubes, two of the Sorensen DC power supplies were connected in parallel to provide adequate current. For these cases, a HDR ZFL480-40C AC power supply, with 40 V maximum output, was used to provide power to the filament. The DC power supplies provided a very stable source of current that allowed precise temperature control. Temperature feedback was obtained in two ways. A type K (chromel-alumel) thermocouple was spot-welded onto the outer surface of the tubes and pipes, and the signal was fed through a port in the vacuum chamber to a digital thermometer and a computer-based data logger. In addition, a $E^2$ Technologies Pulsar II infrared (IR) detector was focused on the outer surface of the sample near the thermocouple leads via a quartz window near the midplane of the vacuum chamber. The IR detector allowed variable emissivity input to accurately measure the temperature of a variety of materials. The emissivity for clean 4130 steel, type 316 stainless steel and aluminum alloy 6061 were experimentally determined as a function of temperature by comparing thermocouple and IR detector output.

When using Al source materials, the typical coating run included a pre-heat to a tube temperature of approximately 350° C., followed by a rapid increase in filament temperature until the tube temperature reached 500–900° C. Control of the coating microstructure and composition was controlled primarily by the peak temperature achieved during coating, although the total time at temperature also had an impact on the coating composition. The Al in the filament melts at 660° C., but high deposition rates are not achieved until the vapor pressure reaches approximately $10^{-2}$ torr. This condition occurs at approximately 1200° C. for Al as reported in Mattox, DM. 1998. *Handbook of Physical Vapor Deposition (PVD) Processing*. Park Ridge, N.J.: Noyes Publications.

The heating rate of the filament must be sufficiently high to traverse the range 660–1200° C. quickly, because the Al will not wet the W filament below about 900° C. Between 660° C. and 900° C., the Al will flow down the filament and can cause an electrical short between the filament and the tube if a large-enough droplet of Al bridges the gap between the two. However, if the filament heating rate is too high, the Al will not evaporate as individual atoms, but rather as micron-scale droplets that result in rough and poorly bonded coatings. Cooling after coating deposition was conducted in vacuum to below 300° C., at which point argon was introduced to the vacuum chamber. The vacuum chamber was not opened to the atmosphere until the sample had cooled to below 100° C.

When using Fe or Ni source materials, a single coating pulse typically was not feasible due to the higher temperatures necessary to achieve rapid deposition rates for these metals. Nickel and Fe melt at 1453° C. and 1535° C., respectively, and the temperatures at which they achieve a partial pressure of $10^{-2}$ torr are 1510° C. and 1480° C., respectively. Extended periods of time at these temperatures will weaken the W filaments and cause dimensional distortion or even breakage. As a result, the Fe and Ni coatings were produced by employing multiple short pulses rather than a single longer pulse, as with the Al coatings. Typically, the filament was allowed to pre-heat to approximately 1100° C., followed by a rapid increase to 1500–1600° C. for a few seconds, then reduced to the pre-heat temperature of 800–900° C. Multiple coating pulses proved an effective way to control thickness, as long as the 6061 substrate was cleaned and heated sufficiently to ensure bonding between the different coating layers.

When co-depositing Fe and Al from the same filament, a single short pulse typically was used. Sufficient current was applied to the filament to rapidly pass through the Al and Fe evaporation temperatures as quickly as possible to minimize the time between Al and Fe deposition. The filament typically was pre-heated to approximately 500° C., followed by a rapid increase to 1600° C. (or higher) for a few seconds. Multiple pulse were not considered due to the fact that all of the Al would have been deposited during the first pulse. Therefore, process parameters were selected to ensure complete Fe evaporation in a single pulse.

Figure 4:
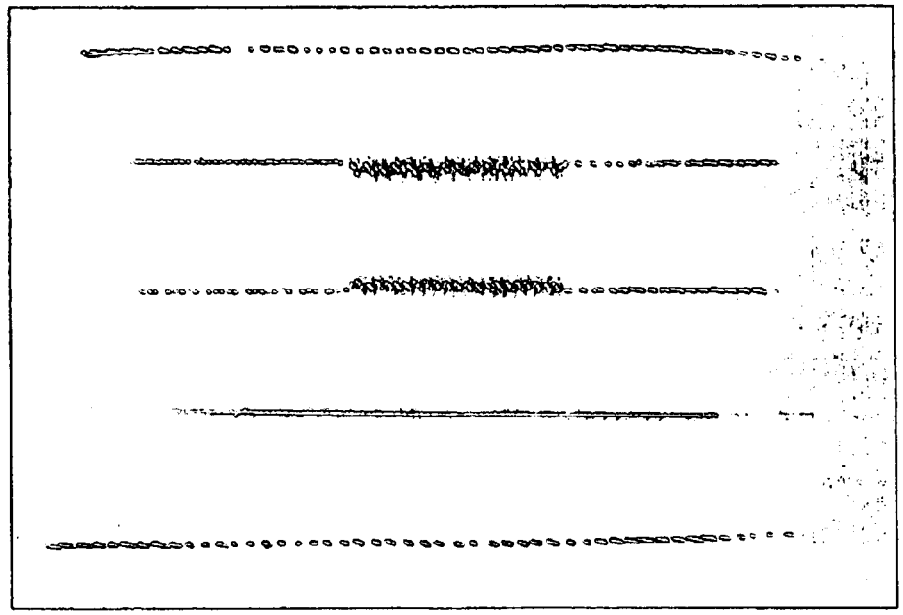
FIG. 4. is a photograph of the various filaments used in experiments to demonstrate the present invention including (from top to bottom) 0.030-n. W/Al 1×7 stranded filament, 14-wrap 0.020-in. 1×4 stranded and coiled filament, 21-wrap 0.020-in. 1×4 stranded and coiled filament, 0.070-in. W rod with 0.020-in. W wire wrap and double 0.014-in. Fe wire wrap, and 0.040-in. W/Ni 1×7 stranded filament.

Several W/Al filament designs were tested throughout the course of the study. The initial Al coating attempts on the 0.375-in. diameter tubes were made with 1×7 stranded filaments composed of one 0.030-in. Al wire surrounded by six spirally-wrapped 0.030-in. W wires. The wire pitch was approximately 0.81 in., and the Al wire was completely enclosed by W. The 1×7 stranded filaments were purchased from Osram Sylvania, and are shown in FIG. 4. Unfortunately, the gap between the filament and the inner surface of the tube was too large to allow effective radiant beating of the tube, and the maximum tube temperature achievable in this configuration Was only about 400° C., which limited interdiffusion between Al and the substrate. To achieve higher temperatures and a wider range of coating compositions, a coiled, loose-lay (i.e. the Al was not completely enclosed by W) stranded filament design was used. These filaments had three 0.020-in. W wires stranded together with a 0.020-in. Al wire, and the stranded filament was then wrapped around a mandrel to produce the final coiled filament. The coiled filaments were purchased from RD Mathis Portland, Oreg., and are shown in FIG. 4. The initial coiled filaments had an OD of 0.25 in. and 14 spiral wraps over a 2-in. length. Later filaments had an OD of 0.22 in. to ease alignment concerns while still providing adequate radiant heating to the tube, and they incorporated 21 spiral wraps over a 2-in. length to increase the amount of Al available for deposition. FIG. 4 shows a typical 21-wrap coiled W/Al filament. The Fe source material was 0.014-in. wire, two of which were wrapped onto a 0.070-in. diameter W rod between a 0.020-in. diameter W wire wrap with 0.060-in. pitch, as shown in FIG. 4. The Fe wire was purchased from Ed Fagan, Sacramento Calif., while the W-wire-wrapped W rods were purchased from RD Mathis. When co-depositing Al and Fe, the RD Mathis filaments were used with 0.014-in. Fe wire and 0.020-in. Al wire uniformly wrapped in the desired mass ratio. The Ni source material was a 1×7 W/Ni stranded filament, analogous to the 1×7 W/Al filaments described above, except the Ni and W wire diameters were 0.040 in. The W/Ni filaments were purchased from Osram Sylvania Pa., and are shown in FIG. 4.

Figure 5:
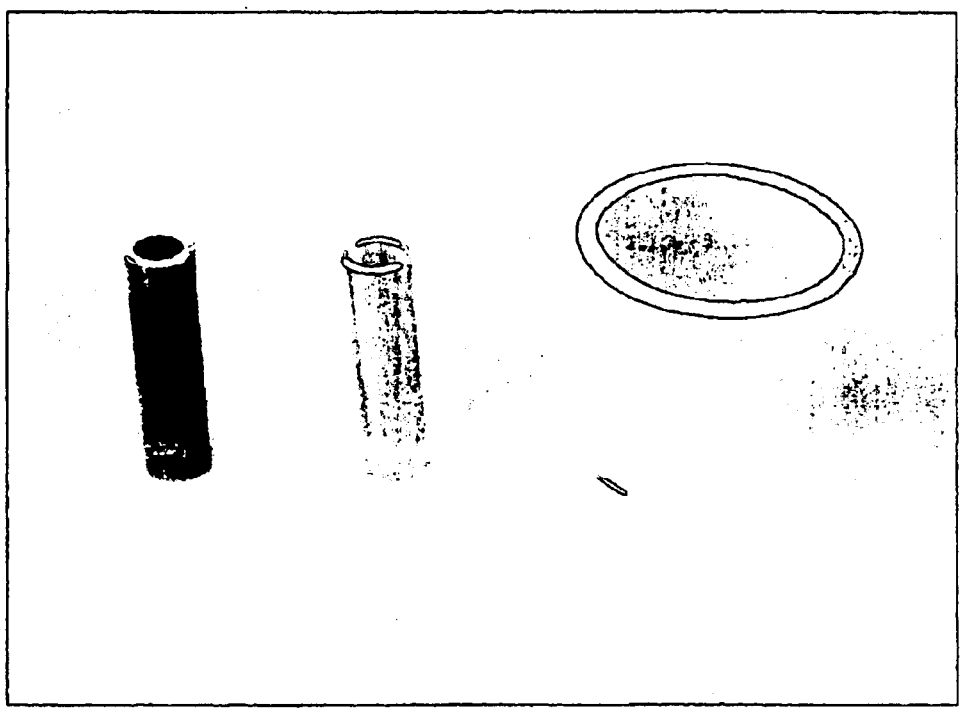
FIG. 5. is a photograph of the various substrate materials used in experiments to demonstrate the present invention including (from left to right) 0.375-in. diameter 4130 steel, 0.375-in. diameter 316 stainless steel, and 2.0-in. diameter 6061 Al-base alloy.

The AISI 4130 steel (nominal composition Fe-0.95Cr0.5Mn-0.3C-0.2Mo) was selected as a readily-available representative high-strength steel that could serve as an analog for heavy-duty diesel engine fuel injector nozzles. Type 316 stainless steel (nominal composition Fe-17Cr-12Ni-2.5Mo) was selected as a representative material for hydraulic fluid piping and related components. Finally, aluminum alloy 6061 was selected as a readily-available analog for aluminum-alloy engine cylinders and diesel engine exhaust gas recirculator heat exchanger tubing. Surface preparation of all these alloys was critical to obtaining good coating adhesion and interdiffusion. The 4130 samples were soaked in a solution of hydrochloric acid for 30–45 min, followed by abrasion with 600 grit sandpaper to remove any remaining soot. The 6061 samples were soaked in a solution of sodium hydroxide for 60 min. The 316SS samples required no special surface preparation. All three materials were given an ethanol wash immediately before loading in the vacuum chamber to remove any loose particulate. After etching and cleaning, the samples were handled with gloves to avoid introducing any volatile contaminants into the vacuum chamber. The 4130 and 6061 samples were placed under vacuum within a few minutes after finishing the cleaning process to avoid excessive growth of surface oxides prior to coating. No such precautions were necessary with the 316SS samples. All three of the materials are shown in FIG. 5, in the 2-in. length that was used for coating development.

The coated samples were sectioned both longitudinally, to evaluate coating uniformity along the length of the sample, and transversely, to evaluate the circumferential uniformity of the coating. Optical microscopy also was performed to evaluate adhesion and provide feedback for coating process parameter development. Knoop hardness measurements were performed on selected metallographic samples using a Future Tech FM microhardness testing apparatus. All hardness measurements were made with a 25 g load on the indenter. Selected metallographic sample mounts were examined in more detail via scanning electron microscopy (SEM) using a Jeol JSM 840 microscope in both secondary and backscattered electron modes, as appropriate. Finally coating composition was evaluated using energy dispersive x-ray spectroscopy (EDS). The EDS detector was manufactured by Robinson and the software used to quantify the data was ISIS 300. The EDS spectra were calibrated by Oxford Scientific using traceable standards.

Figure 6:
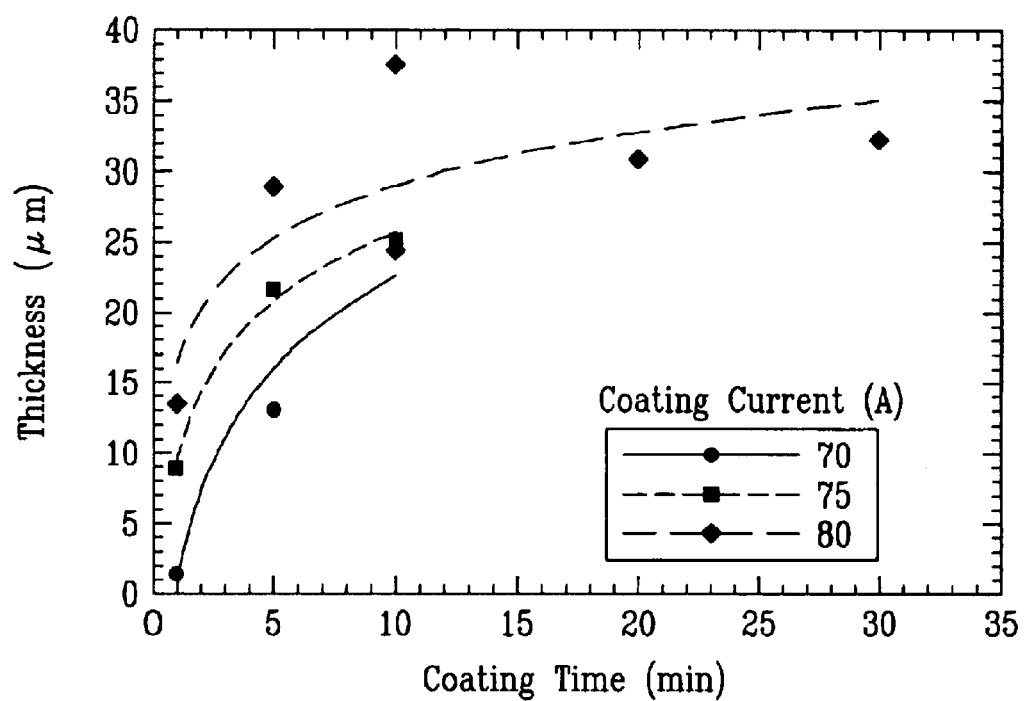
FIG. 6. is a graph showing the control of Al coating thickness on 4130 steel tubes using filament current and deposition time in experiments conducted to demonstrate the present invention.

The aluminide coatings deposited on the 4130 steel tubes were produced in thicknesses ranging from 2 $\mu$m to just over 30 $\mu$m using the stranded filaments shown in FIG. 4. The coating thickness was controlled by the adjusting the current through the filament and the deposition time. FIG. 6 shows the relationship between coating thickness, filament current and deposition time. These data highlight the predictability of the IPVD process and the manner in which parameters for a specific coating thickness may be selected. The upper limit of 30 $\mu$m represented deposition of all the available Al in the 0.030-in. 1×7 stranded W/Al filaments. Thicker coatings were produced in later experiments by using the coiled filaments that incorporated more Al. The typical thickness of coatings produced using the 14-wrap coiled filaments was about 45 $\mu$m, while the typical thickness of coatings produced using the 21-wrap coiled filaments was about 60 $\mu$m.

Figure 7:
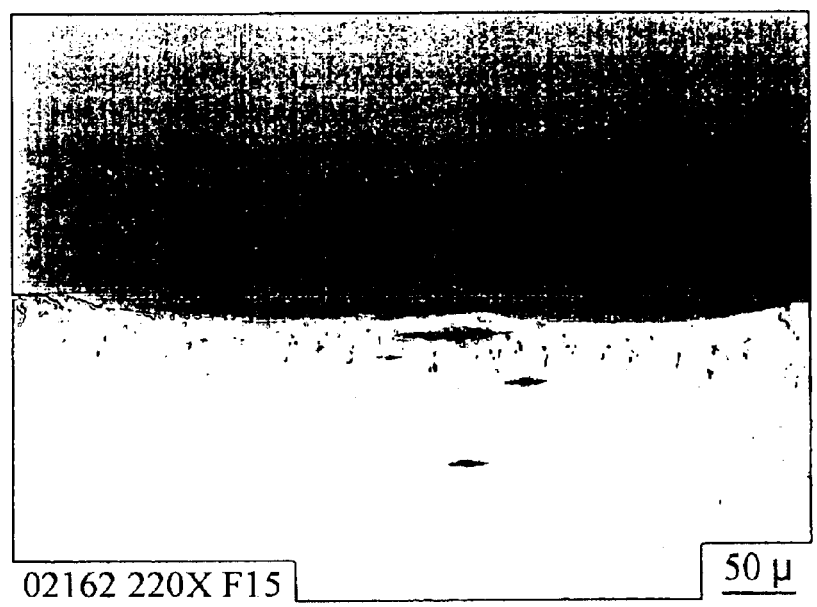
FIG. 7. is an optical micrograph of a sample processed to a peak 4130 tube temperature of 676° C., and showing the Knoop hardness test indentations in the various layers of the coating (interphase $H_K$=797) in an experiment conducted to demonstrate the present invention.

FIG. 7 shows a representative optical micrograph of an aluminide coating on 4130 steel. Typically, these coatings exhibited two layers with different Al concentrations. In general, they all exhibited good adhesion with visible diffusion bonding as long as the surface was etched prior to coating. Coating thickness was uniform both around the circumference of the tube and along its length. The coating layer adjacent to the substrate (the interphase) typically was much harder than the substrate and the surface layer. Depending on the peak temperature experienced by the tube during coating, the interphase tended to have a composition close to one of three intermetallic phases. In order of increasing peak temperature these were $FeAl_3$, $Fe_2Al_5$, and $FeAl_2$. The thickness of the interphase varied from 40–80% of the toal coating thickness, with the relative interphase thickness varying as a function of the peak tube temperature. The surface layer of the coating tended to be a two-phase mixture of $FeAl_3$ and Al, and typically exhibited some degree of porosity mostly oriented in the radial direction. Some coatings exhibited circumferential cracks between the interphase and the surface layer. The circumferential cracks generally were associated with the presence of $Fe_2Al_5$ interphase layers, which tend to be very brittle. The circumferential cracks probably formed during cooling in response to differential thermal stresses, and cracks like these are very undesirable because they lead to spalling of the surface coating layers. The radial cracks potentially could be beneficial, however, because they could improve the self-lubricating ability of the coating by holding fuel or oil. Similarly, the Al-rich surface layer could be beneficial if a compliant layer was desirable over the hard interphase layer. If the Al-rich layer was not desirable for a given application, the interior surface of the tube could be easily machined to remove or thin it. The process of machining the surface layer also might heal the exposed radial cracks if a porous coating was not desirable.

Figure 8:
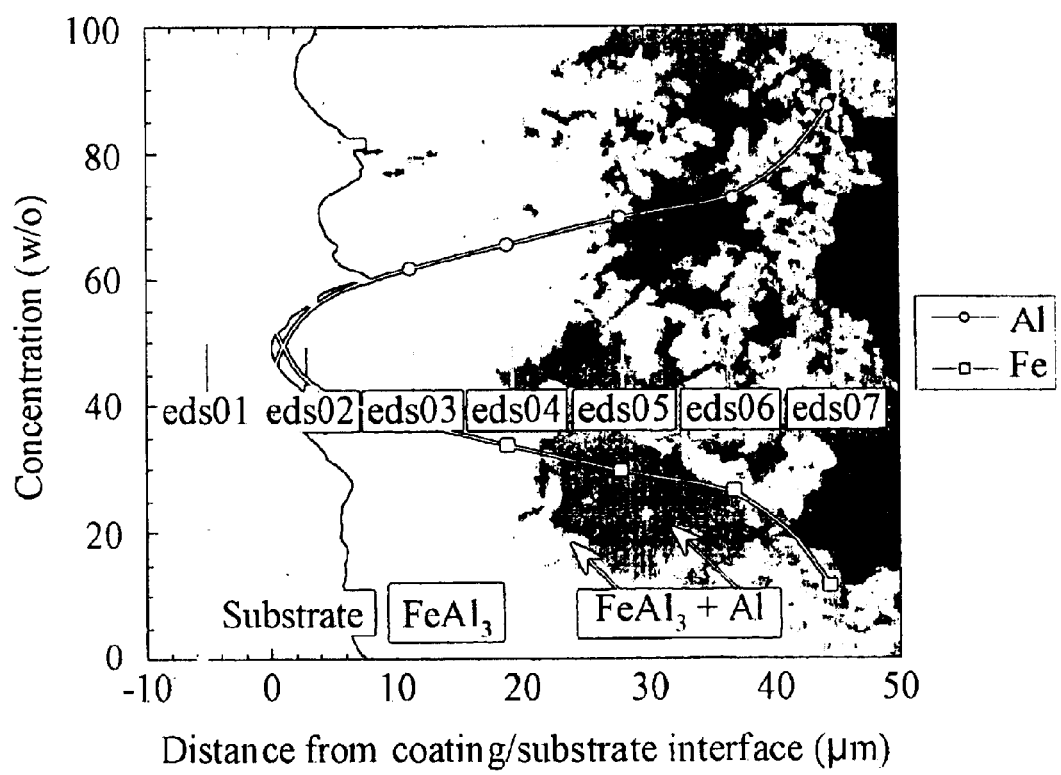
FIG. 8. is a graph of the composition profile superimposed over an SEM image of a coating processed to a peak 4130 tube temperature of 640° C. and exhibiting an interphase hardness of 864 $H_K$.

FIG. 8 shows a representative Al and Fe composition profile obtained via EDS superimposed over the corresponding SEM image. The image shows good bonding and interdiffusion between the aluminide coating and the 4130 substrate. The two-layer microstructure of the coating is clearly evident, with an interphase of $FeAl_3$ and a two-phase ($FeAl_3$+Al) surface layer with Al content increasing to greater than 80 w/o at the coating surface. The thickness of the interphase is 10–15 $\mu$m and is relatively uniform. The coating shown in FIG. 8 was taken from a sample processed to a peak temperature of 640° C., with an interphase hardness of 864 $H_K$. Although the two-layer microstructure of the coating is very similar to the sample shown in FIG. 7, the composition of the interphase is different. The sample in FIG. 7 possessed a $Fe_2Al_5$ interphase, while the sample in FIG. 8 possessed a $FeAl_3$ interphase, suggesting that the transition from $FeAl_3$ and $Fe_2Al_5$ occurs between peak temperatures of 640° C. and 676° C.

Figure 9:
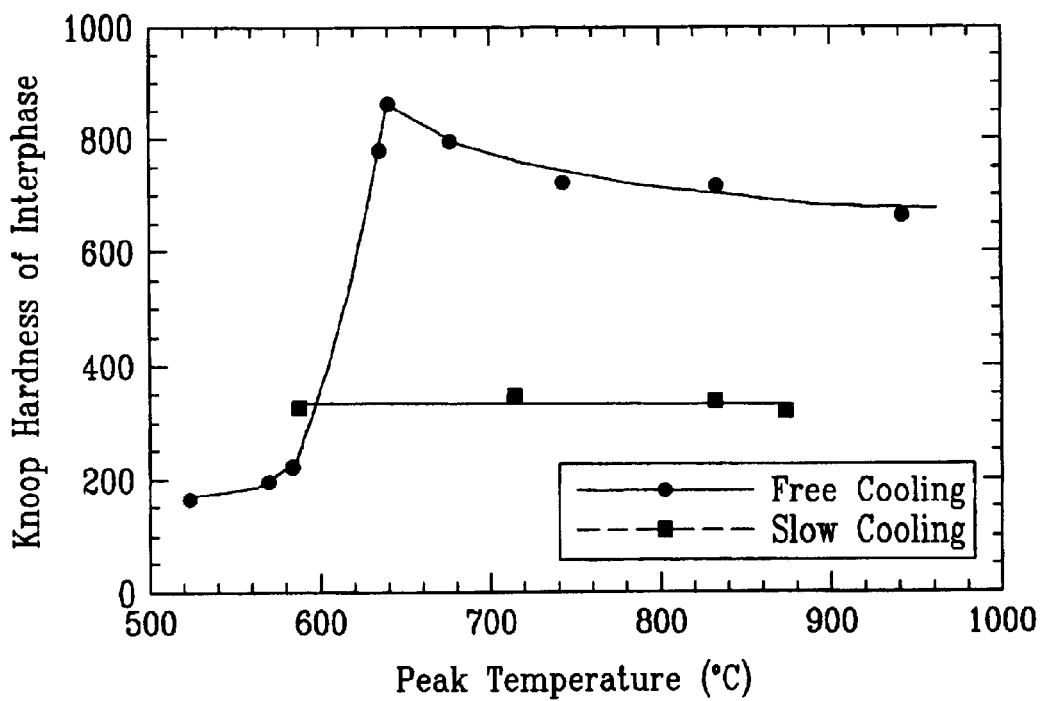
FIG. 9. is a graph showing the hardness of the interphase as a function of peak 4130 tube temperature and post-deposition tube cooling rate.

FIG. 9 shows the hardness of the interphase as a function of the peak processing temperature of the tube and the total time at temperature. The peak hardness occurred at a peak temperature of approximately 650° C. Below this temperature there is a rapid decrease in hardness of the interphase, while above this temperature the decrease is less dramatic. The data along the curve labeled "free cooling" in FIG. 9 were taken from tubes that were allowed to cool to 300° C. in vacuum with no power to the filament. The cooling rate for the curve labeled "slow cooling" in FIG. 9 was controlled by slowly decreasing power to the filament after deposition. When the coated tubes were cooled at half the free-cooling rate after deposition, the increased time at temperature resulted in a softening of the interphase relative to the freely-cooled tubes coated to the same peak temperature. Interestingly, the slowly-cooled tubes exhibited an interphase with hardness independent of peak temperature. No EDS data were obtained for the coatings on the slowly-cooled tubes, so the composition of their interphase was not determined.

Figure 10:
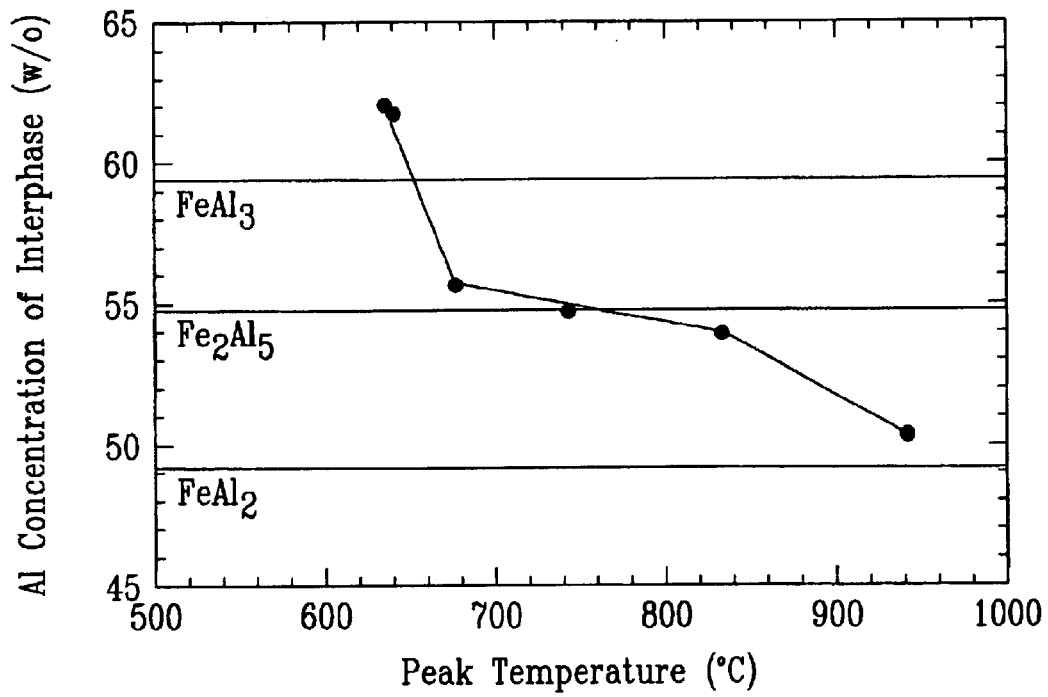
FIG. 10. is a graph showing the relationship between interphase Al concentration and peak 4130 tube temperature.
Figure 11:
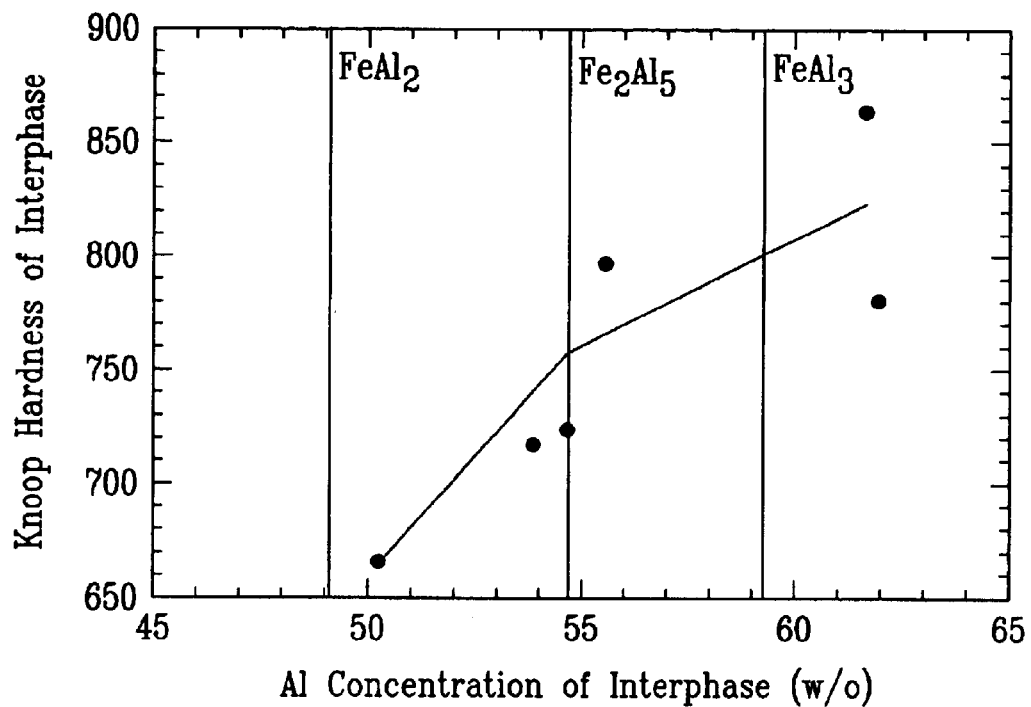
FIG. 11. is a graph showing the relationship between interphase hardness and Al concentration for coatings on 4130 steel.

FIG. 10 relates the composition of the interphase to the peak coating temperature, while FIG. 11 shows the dependence of interphase hardness on composition. By comparing these plots with the data in FIG. 9, one can draw conclusions regarding the composition of the interphase that produces the peak hardness. It appears that the peak hardness in FIG. 9 (average $H_K$=823) corresponds to a $FeAl_3$ phase at 63 w/o Al. This composition is within the solubility range of $FeAl_3$ near 650° C., according to the Fe-Al phase diagram shown in Kubachewski, O. 1982. *Iron-Binary Phase Diagrams*. Berlin, Germany: Springer-Verlag. The plateau in hardness in FIG. 9 (average $H_K$=746) between peak temperatures of 650° C. and 850° C. corresponds closely to a $Fe_2Al_5$ composition, while the slightly lower hardness value ($H_K$= 666) above 850° C. appear to correspond to a $FeAl_2$ composition. Peak temperatures lower than 600° C. produce coating compositions very rich in Al without the hard interphase, which explains the rapid decrease in hardness below a peak temperature of 650° C.

Figure 12:
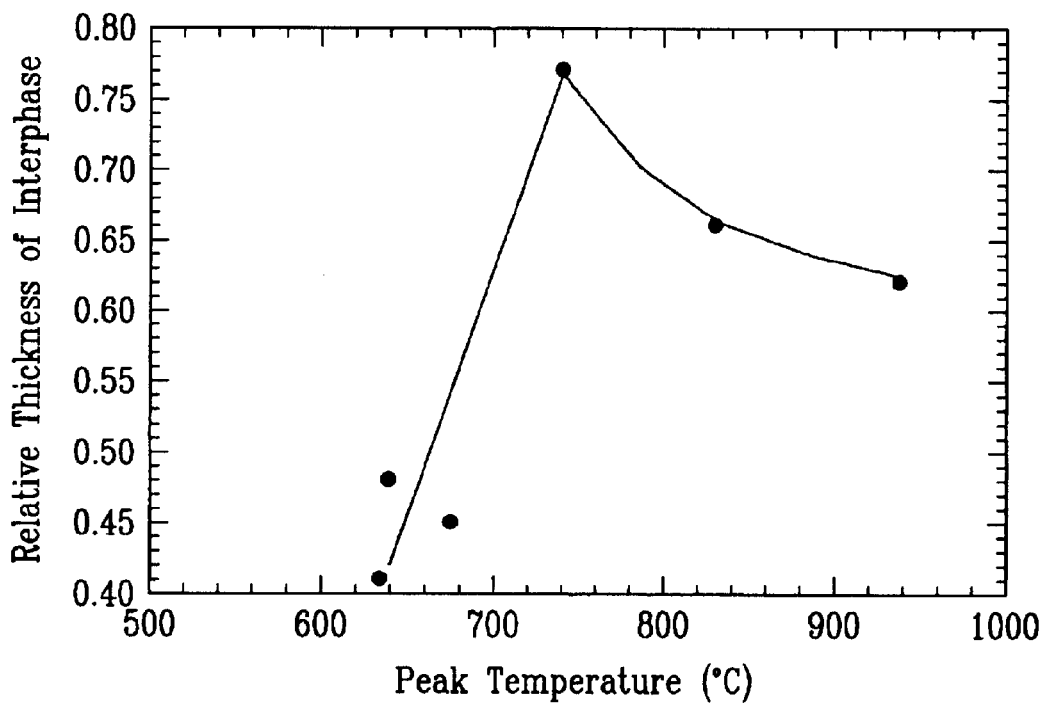
FIG. 12. is a graph showing the interphase thickness as a function of peak 4130 tube temperature.

The measured hardness of the $FeAl_3$ interphase (823 $H_K$) agrees reasonably well with literature values (764 $H_K$), while the measured hardness of the $Fe_2Al_5$ interphase (746 $H_K$) is about 20% below literature values (933 $H_K$) reported in Ivanko, AA. 1971. *Handbook of Hardness Data*. Washington, D.C.: National Bureau of Standards. The scatter in the hardness values for a given composition in FIG. 11 probably is due to the fact that the interphase tends to be thin relative to the Knoop hardness indenter. FIG. 12 shows the thickness of the interphase as a fraction of the total coating thickness as a function of peak tube temperature. The coatings represented by the data in FIG. 12 were produced with three different filaments having three different amounts of Al available, which produced different overall coating thicknesses as described herein. Therefore, a relative measure of the interphase thickness is necessary to compare between coatings produced with different filament types. Coatings deposited at a peak tube temperature of approximately 750° C. appear to produce the thickest interphase layers relative to the total coating thickness. In absolute terms, the data point in FIG. 12 at the peak of the curve corresponds to an interphase thickness of about 40 μm in a 52 μm coating. The harder $FeAl_3$ interphases produced at peak tube temperatures near 650° C. had thicknesses between 40% and 50% of the overall coating thickness.

Figure 13:
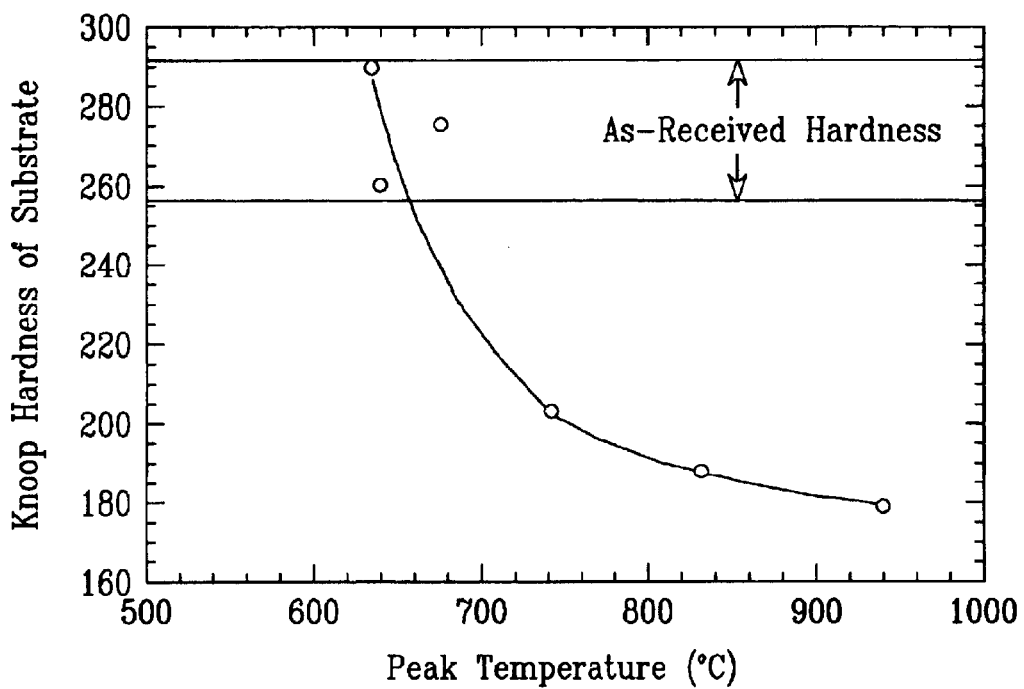
FIG. 13. is a graph showing the hardness of the 4130 steel substrate as a function of peak tube temperature during coating.

In order to avoid annealing the 4130 steel substrate, it was important to determine the upper limit on peak tube temperature. FIG. 13 shows hardness data for tubes processed between 635° C. and 940° C. The horizontal band between 256 $H_K$ and 291 $H_K$ represents the range of hardness values measured on as-received 4130 steel tubes. Based on these data, it appears that peak temperatures up to at least 676° C. do not significantly soften the steel substrate. While specific peak temperature limits must be determined independently different substrate materials, the data in FIG. 13 demonstrate that hard aluminide coatings can be deposited on alloy steels using IPVD without annealing the substrate.

Figure 14:
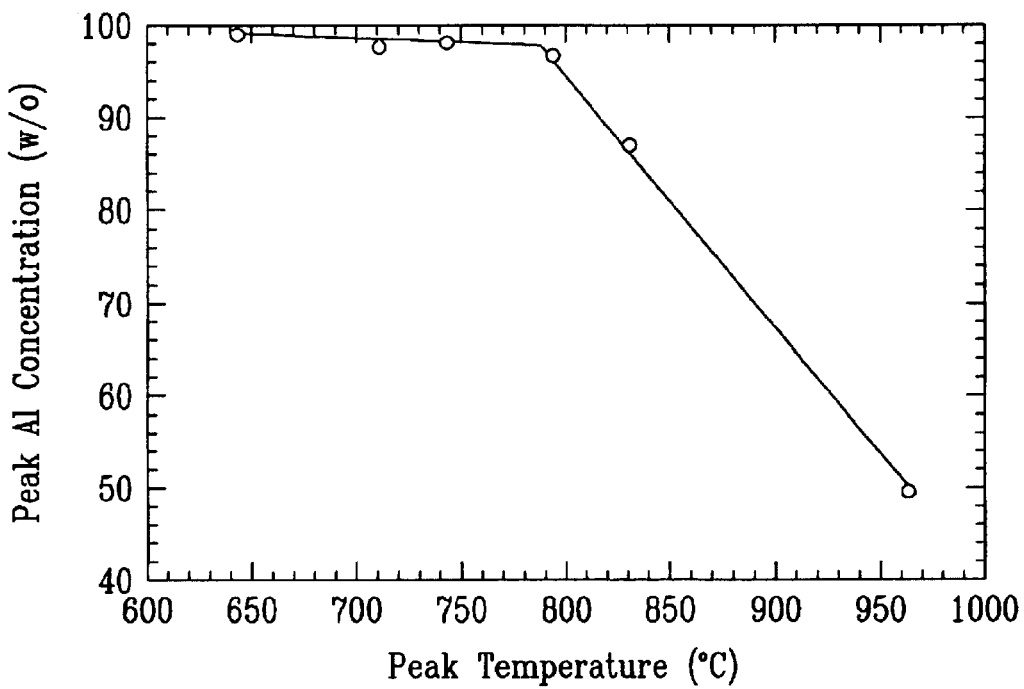
FIG. 14. is a graph showing the coating composition control as a function of peak substrate temperature in two varieties of stainless steel.

FIG. 14 shows the peak Al concentration in the coatings on type 316 stainless steel tubes. The important fact to be discerned from the data in FIG. 14 is that the composition of the coatings is a predictable function of the peak substrate temperature. Thickness of the coatings on 316SS was not varied because only one filament type was used. However, the thickness of these coatings could be controlled in the same manner as demonstrated on the 4130 coatings shown in FIG. 6.

Figure 15:
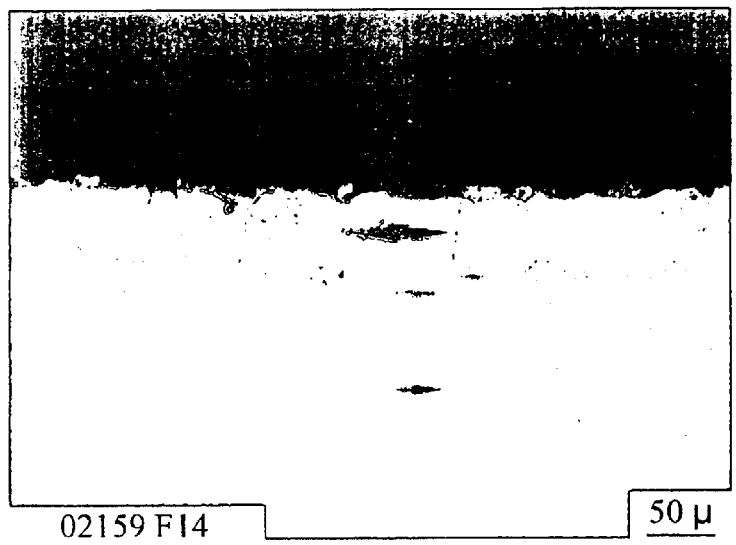
FIG. 15. is an optical micrograph of a sample processed to a peak 316SS tube temperature of 792° C., and showing the Knoop hardness test indentations in the various layers of the coating (interphase $H_K$=709).

FIG. 15 shows a representative optical micrograph of an aluminide coating on the inner surface of a 0.375-in. 316SS tube. In general, the microstructure of the aluminide coatings on 316SS were similar to those on 4130. The coatings all exhibited good adhesion and diffusion bonding, without any special surface preparation other than light swabbing with ethanol. Circumferential and axial thickness uniformity was good. There are two distinct layers in the coating. The layer adjacent to the substrate (interphase) is the harder phase, and varied in Al content as a function of peak tube temperature. The coating in FIG. 15 had an interphase with a composition near $(Fe,Cr,Ni)Al_3$ (also denoted as $MAl_3$). The surface coating layer is a two-phase mixture of $MAl_3$ and Al. The coatings on the 316SS substrate did not exhibit the radially-oriented porosity observed in the coatings on 4130, but coatings on 316SS that had an interphase composition near $M_2Al_5$ exhibited the same circumferential cracking observed in the coatings on 4130 with the $Fe_2Al_5$ interphase. The denser coatings on 316SS would make them more suitable for erosion- or corrosion-resistance, but the hard interphase still would make them suitable for wear-resistance if lubricant retention was not an issue. Also, the Al-rich surface layer in the coatings on 316SS was very soft, which would facilitate post-process machining if required.

Figure 16:
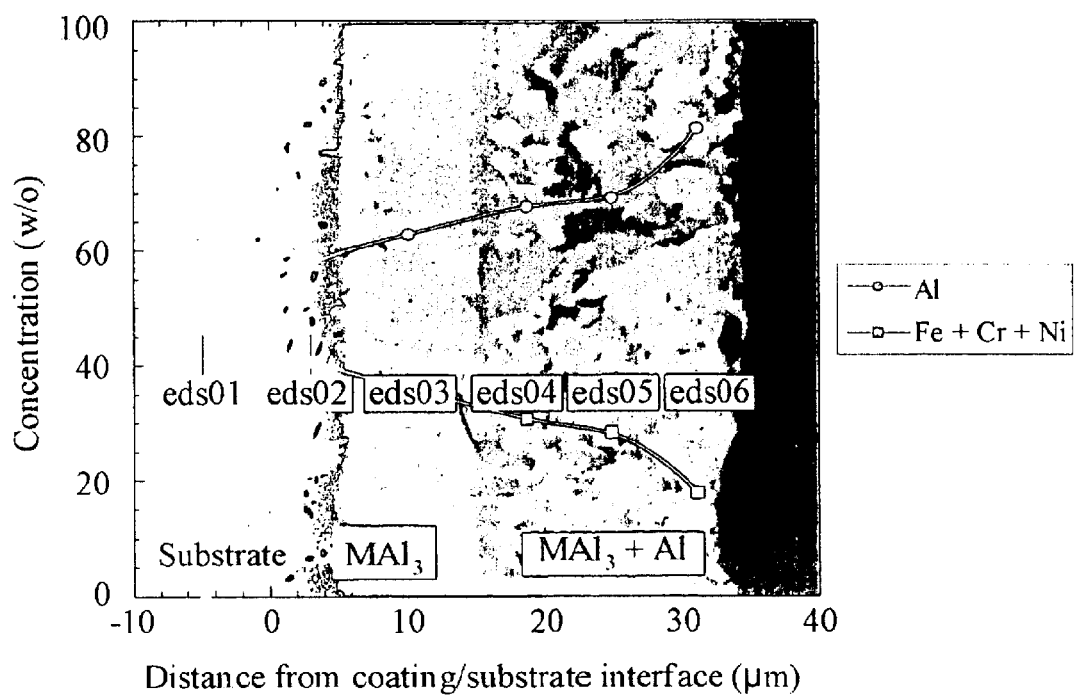
FIG. 16. is a graph showing the composition profile superimposed over an SEM image of a coating processed to a peak 316SS tube temperature of 829° C. and exhibiting an interphase hardness of 560 $H_K$.

FIG. 16 shows an EDS composition profile overlaid on a SEM image of an aluminide coating on 316SS processed to a peak tube temperature of 829° C. The two-layer microstructure is visible in the SEM image, but additional detail is evident in this image as well. The $MAl_3$ interphase increases slightly in Al content with increasing distance from the coating/substrate interface. The Fe content of the $MAl_3$ interphase is relatively constant at 28 w/o throughout its depth, but the Cr content decreases with increasing distance from the coating/substrate interface (6 w/o to 4 w/o) and the Ni content decreases with increasing distance from the coating/substrate interface (5 w/o to 3 w/o). The variation in Al, Cr and Ni content probably are responsible for the difference in compositional contrast seen in the SEM image. Also present in the $MAl_3$ interphase are small, dark precipitates of indeterminate composition. These probably are Fe-, Ni- or Cr-rich precipitates. The microstructure of the $MAl_3$+ Al layer is more complex than the coatings on 4130, with several phases present. The difference in contrast between the various phases probably is due to their relative Al, Fe, Cr, and Ni content.

Figure 17:
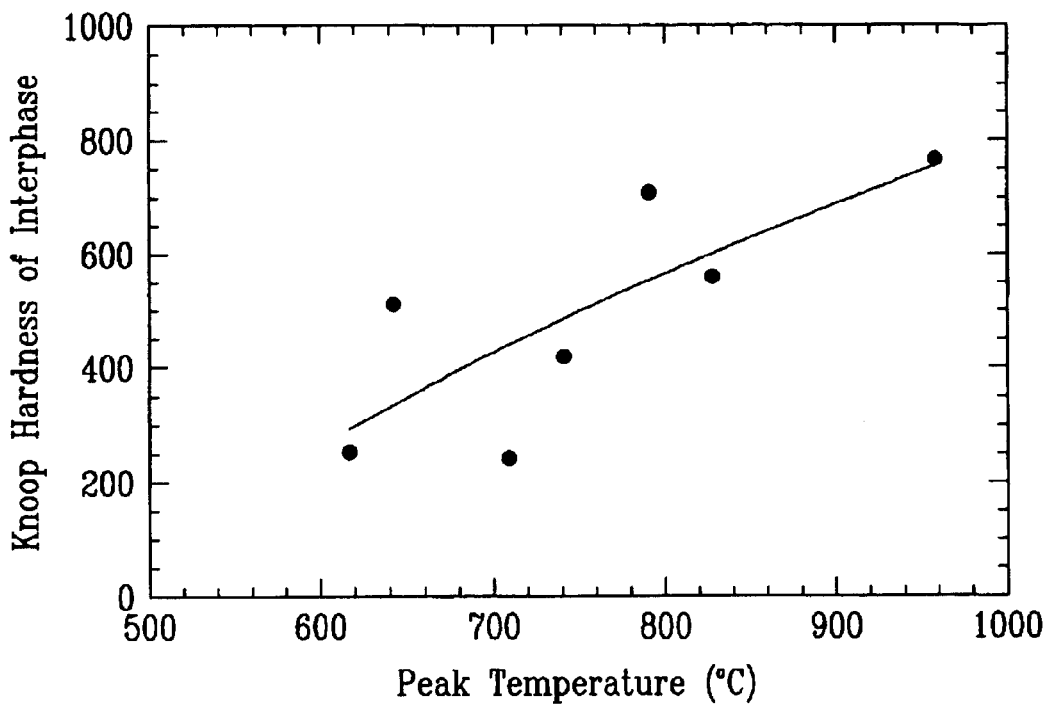
FIG. 17. is a graph showing the hardness of the interphase as a function of peak 316SS tube temperature.

FIG. 17 depicts the Knoop hardness of the interphase as a function of the peak tube temperature for the coatings on 316SS. The trend in hardness is clearly different than observed for coatings on 4130 steel, with hardness increasing with peak temperature between 620° C. and 960° C. There also is significantly more scatter in the hardness data for the coatings on 316SS than for those on 4130. The hardness of the $MAl_3$ interphases range from 243–700 $H_K$. The sample exhibiting the highest hardness had an interphase thickness of 18 μm. The other coatings with $MAl_3$ interphases were only 2–4 μm thick, so their hardness values are questionable because the size of the Knoop indentation in many cases was larger than the interphase thickness. The value of 709 $H_K$ for the 18 μm thick interphase is slightly lower than the hardness of the $FeAl_3$ coatings (781–864 $H_K$), and the difference probably is due to the more complex microstructure and presence of Cr and Ni aluminide phases.

Figure 18:
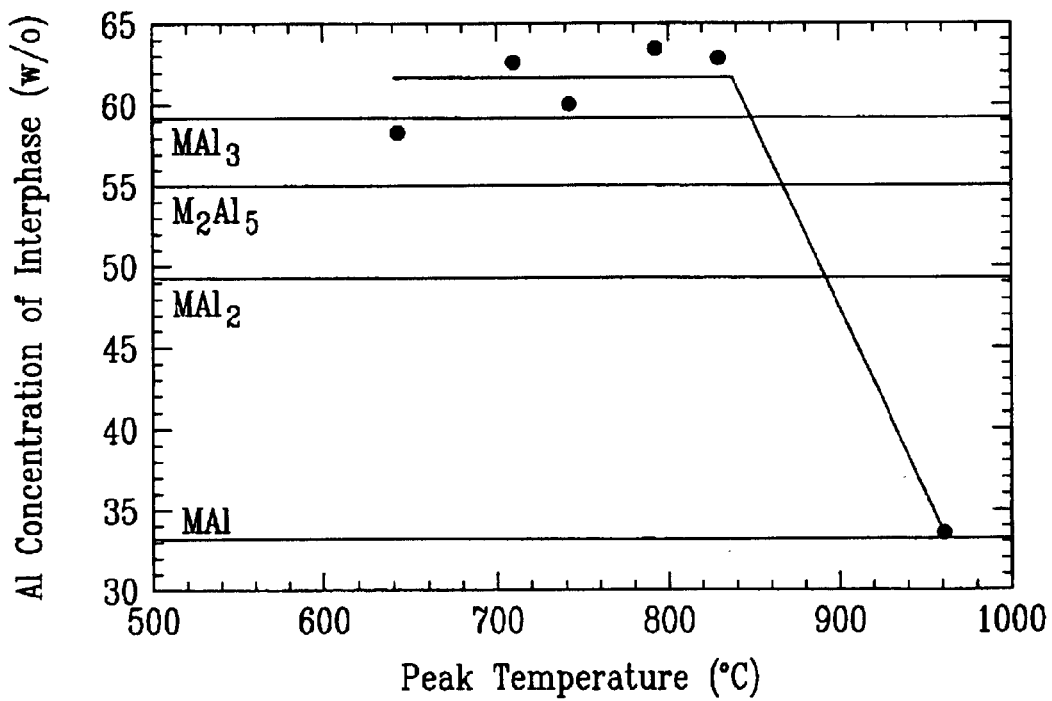
FIG. 18. is a graph showing the relationship between interphase Al concentration and peak 316SS tube temperature.

FIG. 18 relates the interphase Al concentration to the peak tube temperature. Unlike the aluminide coatings on 4130, the interphase composition is relatively independent of peak tube temperature to at least 830° C. Above this temperature, the interphase composition changes dramatically, with a MAl composition achieved at a peak tube temperature of 960° C. Intermediate interphase compositions might be achievable in the temperature range 830–960° C., but no data from the present study were available.

Figure 19:
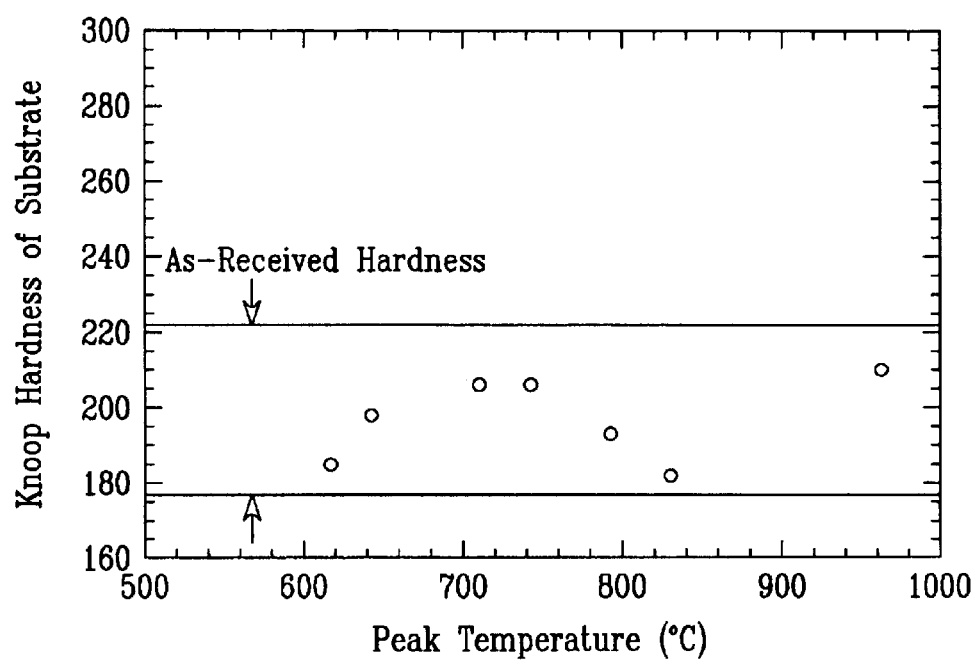
FIG. 19. is a graph showing the hardness of the 316SS substrate as a function of peak tube temperature during coating.

The data in FIG. 19 demonstrate that even at a peak tube temperature of 960° C., the 316SS substrate was not softened. Although the upper coating temperature will be a function of the amount of cold work present and the time spent at temperature, these data at least demonstrate that coatings can be deposited without significantly degrading the stainless steel substrate. Further, for peak tube temperatures in the range 61 8–960° C., radiative cooling in vacuum was sufficient to avoid sensitization in 316SS, as verified by calculations using the SSDOS code described in Bruemmer, SM. 1988. "Quantitative Measurement and Modeling of Sensitization Development in Stainless Steels," *Ph.D. Dissertation*. Beaverton, Oreg.: Oregon Graduate Center.

Figure 20:
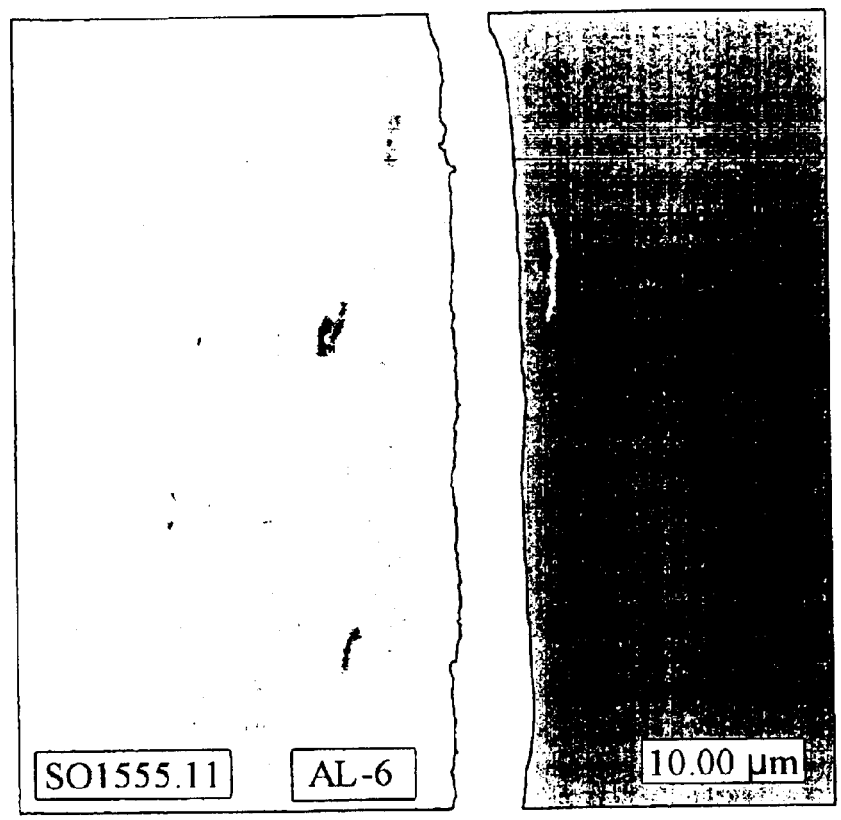
FIG. 20. is a secondary electron SEM image of Ni coating on the inner surface of a 2-in. diameter Al-alloy 6061 cylinder.

FIG. 20 shows a SEM image of a Ni coating deposited on a 2-in. diameter Al-alloy 6061 cylinder. This coating was deposited in five pulses, with the peak cylinder temperature reaching 476° C. on the final pulse. The overall coating thickness was approximately 6 $\mu$m. The coating is well-adhered, smooth, and of uniform thickness. In a few places, the coating exhibited radial cracks that resembled shrinkage cracks from differential thermal stresses. These may have been caused by non-uniformities in the temperature of the Al-alloy cylinder around its periphery.

Figure 21:
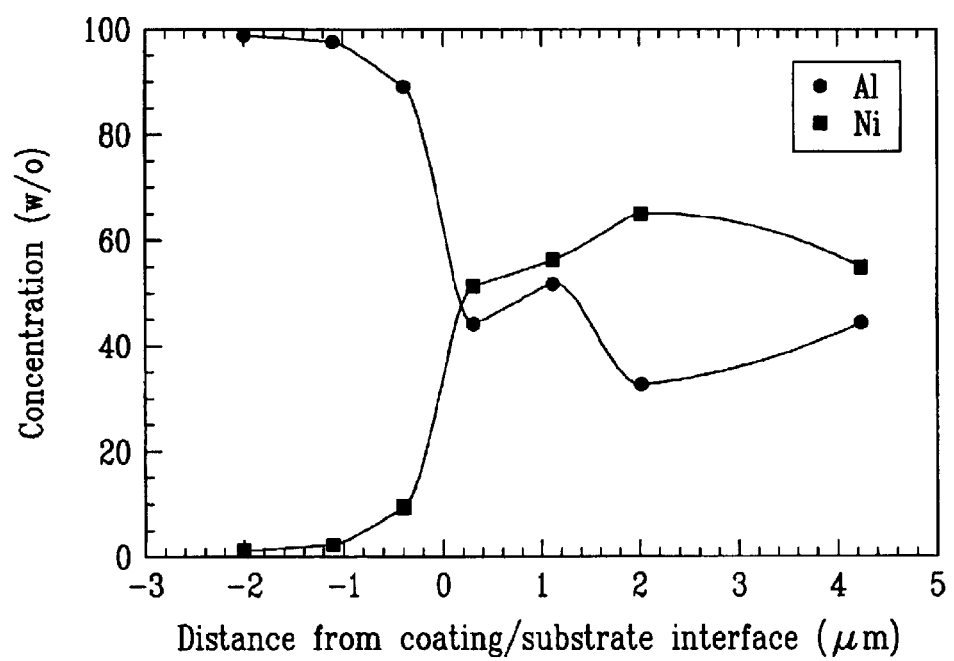
FIG. 21. is a graph showing the Al and Ni concentration profiles in nickel coating on Al 6061.

Little structure is evident within the coating in FIG. 20, but the EDS data shown in FIG. 21 suggest the presence of at least two distinct layers. Adjacent to the substrate the Ni concentration varies between 51 w/o and 56 w/o, suggesting a two-phase mixture of $NiAl_3$ and $Ni_2Al_3$. Closer to the coating surface, the Ni concentration varies between 55 w/o and 65 w/o, which could indicate a two-phase mixture of $Ni_2Al_3$ and NiAl. It is not surprising that there are not broad regions of single-phase nickel aluminides because these intermetallic compounds do not have the wide solubility ranges typically found in the iron aluminides described above for the Al coatings on 4130 and 316SS as described in Dupin, N, I Ansara, HL Lukas and B Sundman. 1997. "An Assessment of the Al-Ni System," *Journal of Alloys and Compounds*, 247:20–30.

Figure 22:
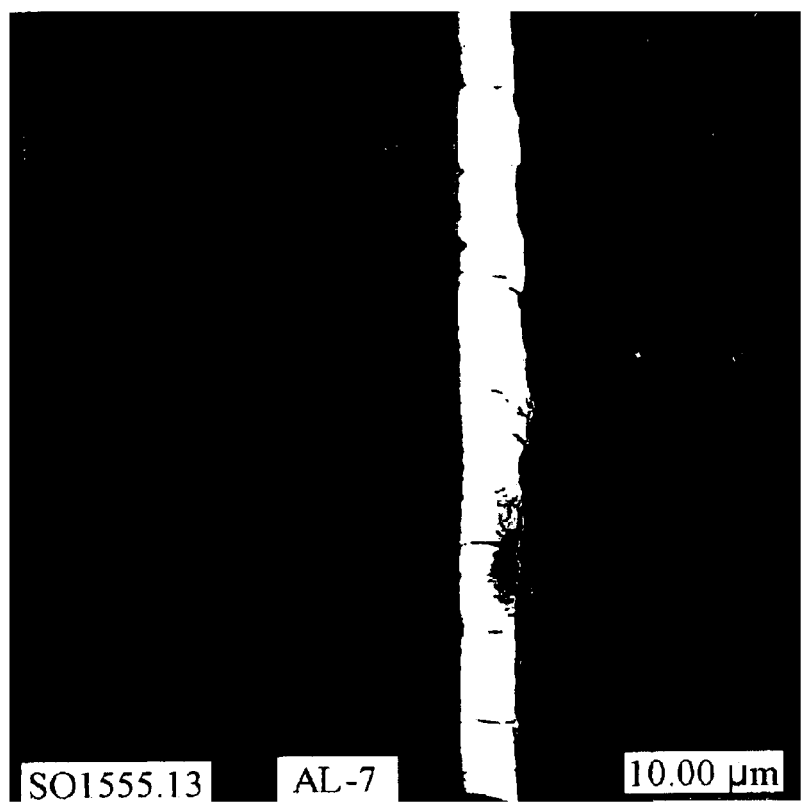
FIG. 22. is a secondary electron SEM image of Fe coating on the inner surface of a 2-in. diameter Al-alloy 6061 cylinder.

FIG. 22 shows a SEM image of a Fe coating on a 2-in. diameter Al alloy 6061 cylinder. This coating was deposited with a single pulse resulting in a peak cylinder temperature of 433° C. The Fe coating appears to be a bit rougher than the Ni coating described above, with more radial cracking. Typically, this type of cracking can be minimized by more uniform substrate temperature control. The coating is well-adhered and the thickness is relatively uniform at about 6 $\mu$m.

Figure 23:
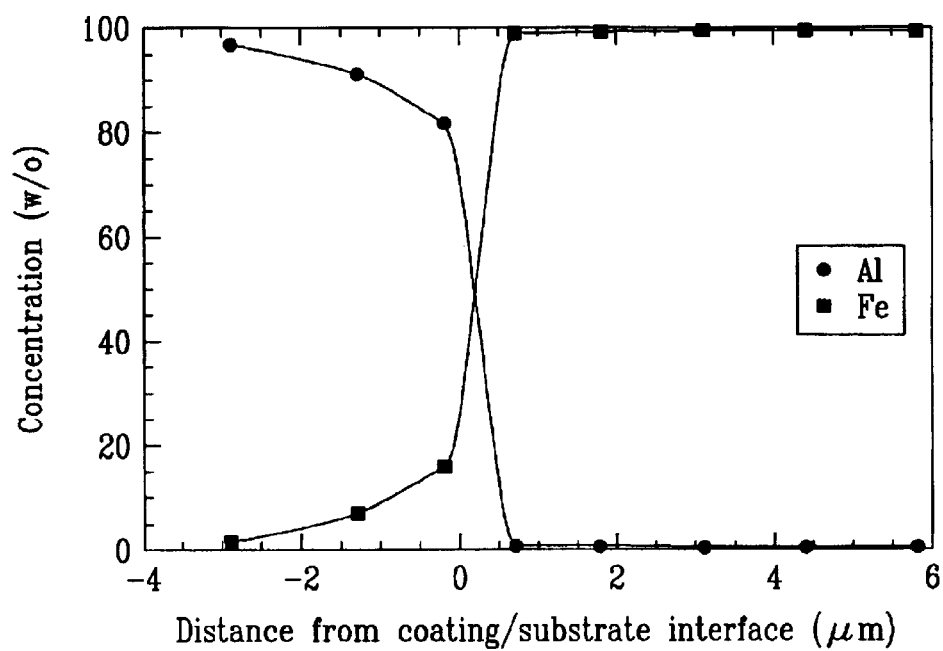
FIG. 23. is a graph showing the Al and Fe concentration profiles in iron coating on Al 6061.

The Al and Fe concentration profile shown in FIG. 23 reveals some Fe diffusion into the 6061 substrate, but little Al diffusion into the Fe coating. Nevertheless, a good diffusion bond was obtained, with an interdiffusion zone about 3 $\mu$m thick. The peak tube temperature of 433° C. in this case probably was too low to create a thick iron aluminide coating on the surface. At slightly higher temperatures, there is a good likelihood of producing an Fe-rich aluminide structure such as $Fe_3Al$, which exhibits many of the attractive features of the $FeAl_3$ coatings described above, but with better ductility and improved oxidation and sulfidation resistance.

Figure 24:
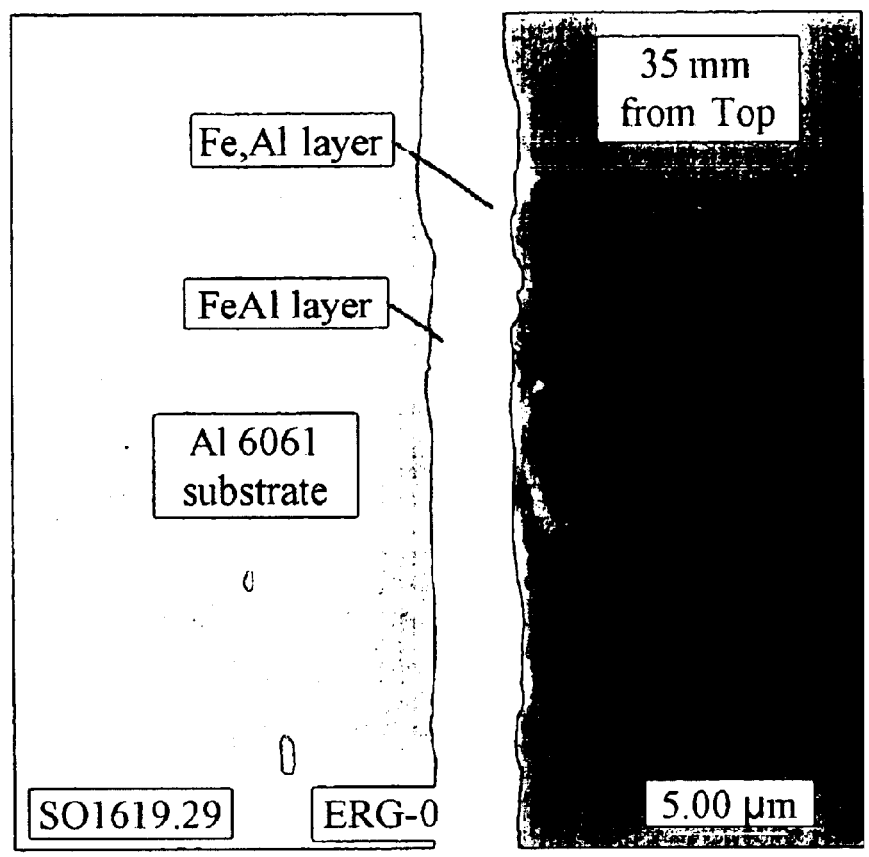
FIG. 24. is a secondary electron SEM image of co-deposited Al/Fe coating on the inner surface of a 1.5-in. diameter Al-alloy 6061 cylinder.

To produce Fe-rich iron aluminides without excessively heating the Al 6061 substrate, Al and Fe were deposited near-simultaneously from the same filament. Although the Al evaporated from the filament slightly before the Fe, the coating materials retained sufficient energy upon deposition to promote thorough mixing. FIG. 24 shows a typical micrograph of the resulting coating on a tube that reached a peak temperature of 340° C. The coating was well-adhered, dense, and smooth. No evidence of radial cracking or spalling was observed. The overall coating thickness was relatively consistent along the length of the tube and around the circumference, varying between 2 $\mu$m and 4 $\mu$m. The coating appeared to consist of two distinct layers that conform to a $Fe_3Al$ composition on the surface and a FeAl composition at the coating/substrate interface. The thickness of the surface layer varied between 1 $\mu$m and 2 $\mu$m along the length of the cylinder.

Figure 25:
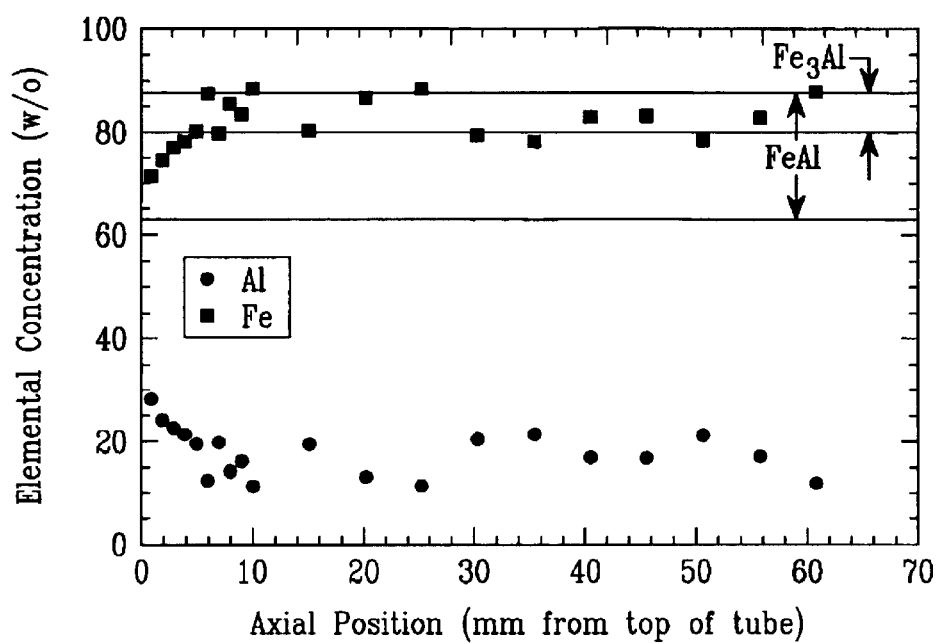
FIG. 25. is a graph showing the composition of the surface layer along the length of the cylinder.
Figure 26:
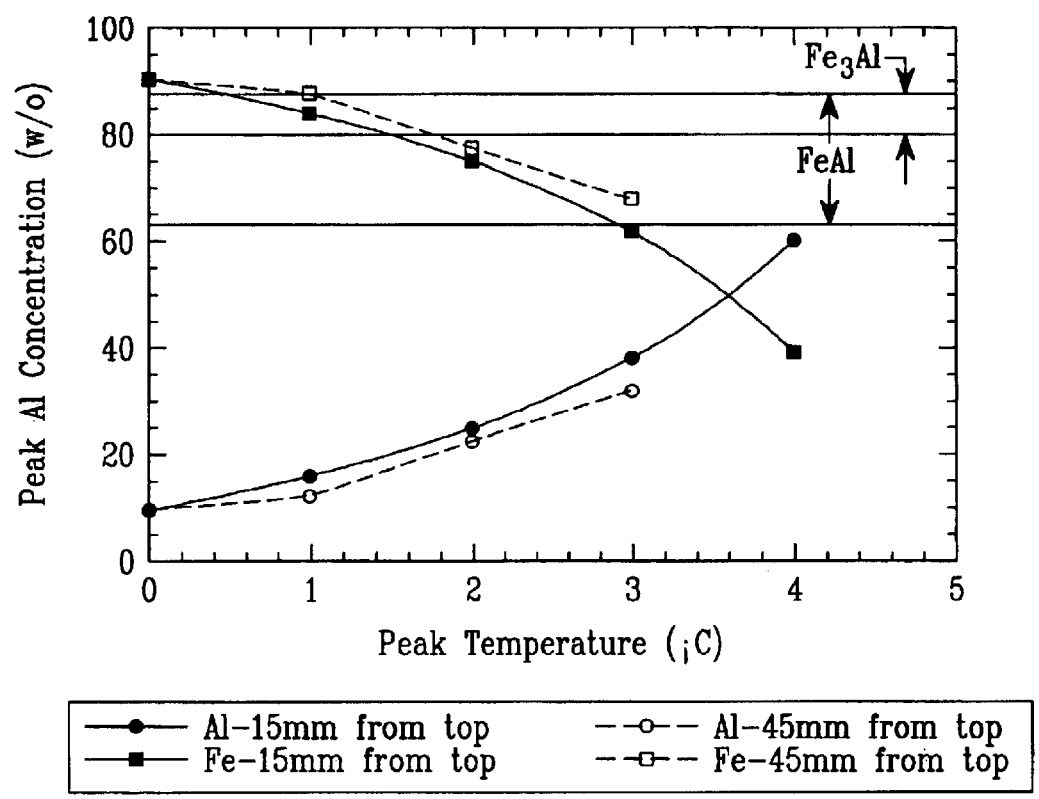
FIG. 26. is a graph showing the composition profiles through the coating at two axial locations.

FIG. 25 shows the composition of the surface layer along the length of the cylinder, and FIG. 26 shows composition profiles through the coating at two axial locations. The surface layer composition is very uniform top-to-bottom, and the depth profiles at the two locations are very similar, even though the overall coating thickness differs by approximately 1 $\mu$m.

Figure 27:
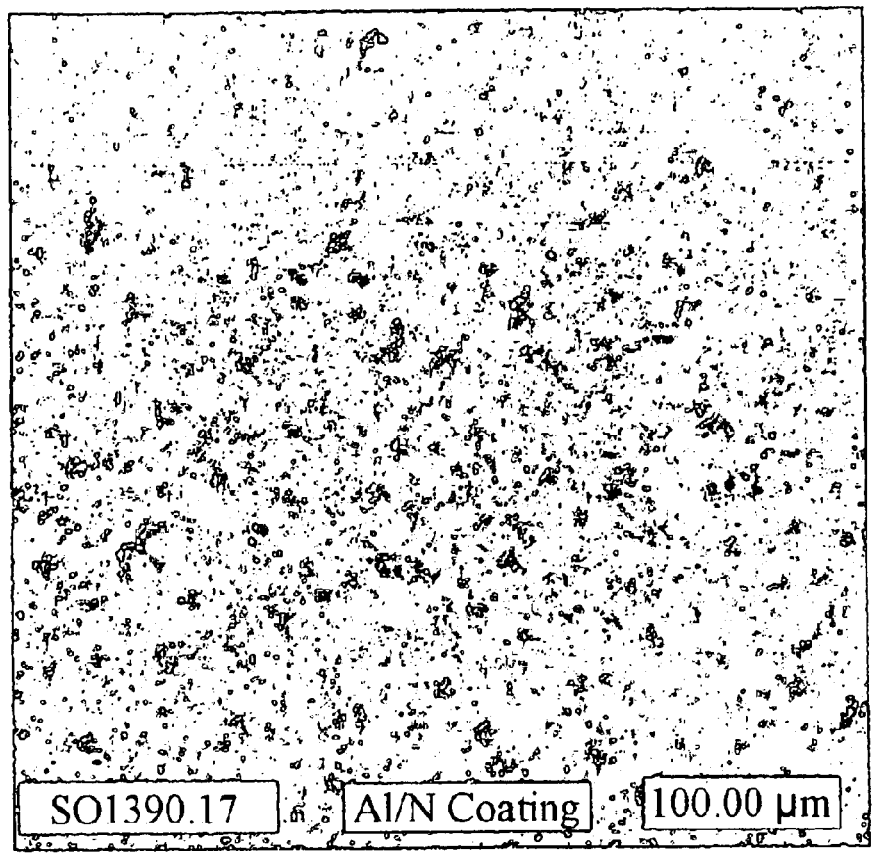
FIG. 27. is a SEM image of the surface of a sub-stoichiometric AlN coating formed in an experiment demonstrating one aspect of the method of the present invention.

Experiments were conducted with Al deposition in a $N_2$ atmosphere in order to produce AlN coatings. Stranded 1×7 filaments containing a 0.030-in. Al wire surrounded by six 0.030-in. W wires were suspended in the center of 14-in. long Type 316 stainless steel tubes with 0.336-in. inner diameter. Tube pre-heat temperatures ranged from 356° C. to 542° C. The deposition of Al typically occurred in a three-step process, with an initial Al melting and tinning step of 75 s at 54–60 A and tube temperatures of 639–698° C., followed by a rapid increase in current to approximately 90 A for 20 s to deposit the Al at peak tube temperatures of 800–962° C. After the initial deposition step, the current typically was reduced to 78–88 A for 30–240 s to limit the peak temperature of the tube to less than 1000° C., provide time for reaction between the Al and $N_2$, and diffuse the Al into the stainless steel substrate. The coating chamber was initially pumped to a vacuum in the $10^{-5}$ to $10^{-6}$ torr range, with $N_2$ added before or during the coating run. A low-pressure regulator was fitted to a $N_2$ cylinder, and a needle valve was used to control the flow of $N_2$ into the coating chamber. In some cases flowing $N_2$ was passed through the chamber before and during the pre-heat and coating steps at partial pressures of $10^{-4}$ to $10^{-1}$ torr. In other tests, $N_2$ was admitted to the chamber and held static at pressures ranging from −4 in. Hg to 5 psig after the tube pre-heat, before the Al deposition step, or immediately after the Al deposition step. Coatings were produced that contained up to 17 a/o N on the surface. A representative SEM image of the surface of such a sub-stoichiometric AlN coating is shown in FIG. 27.

CLOSURE

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

We claim:

1. A method for forming a diffusion coating on the interior surface of a hollow object comprising the steps of:
   a. providing a filament having a coating material thereupon;
   b. extending the filament through the object and adjacent to the interior surface of the object in a vacuum;
   c. resistively heating the filament to a temperature sufficient to transfer the coating material from the filament to the interior surface of the object, wherein the object is electrically isolated from the filament while the filament is being resistively heated; and d. heating the object to a temperature sufficient to form a diffusion coating formed of the object and the coating material on the interior surface of the object.

2. The method of claim 1 wherein the step of transferring the coating material is selected from the group consisting of sublimating the coating material, evaporating the coating material, and combinations thereof.

3. The method of claim 1 wherein the step of heating the object is provided by radiant heating from the filament.

4. The method of claim 1 wherein the step of heating the object is provided by resistive heating from a power source electrically isolated from the filament.

5. The method of claim 1 wherein the object is selected from the group consisting of metallic tubes and metallic pipes.

6. The method of claim 1 wherein the filament is selected from the group consisting of tungsten filament and molybdenum filament.

7. The method of claim 1 wherein the coating material is selected from the group consisting of Ag, Al, As, Au, Ba, Be, Bi, Ca, Cd, Co, Cr, Cu, Dy, Er, Eu, Fe, Ga, Ge, Hg, In, K, Li, Mg, Mn, Na, Ni, P, Pb, Pd, Pr, S, Sb, Sc, Se, Si, Sn, Sr, Te, Tl, Y, Yb, Zn, and combinations thereof.

8. The method of claim 1 wherein the step of extending the filament through the object and adjacent to the interior surface of the object is provided by tensioning the filament.

9. The method of claim 8 wherein the step of tensioning the filament is provided by attaching at least one end of the filament to a spring.

10. The method of claim 1 wherein the step of electrically isolating the object is provided by providing non-conducting guides juxtaposed between the object and the filament.

11. The method of claim 10 wherein the non-conducting guides juxtaposed between the object and the filament are ceramic materials.

12. The method of claim 1 wherein the vacuum is maintained at about $10^{-4}$ Torr.

13. The method of claim 1 wherein the vacuum contains a partial pressure of a gas selected from the group consisting of nitrogen, hydrogen, or hydrocarbon, or combinations thereof.

14. A method for forming a diffusion coating on the interior surface of a metallic pipe comprising the steps of:

a. providing a metallic pipe having an interior diameter less than 0.75 inches;

b. providing a filament having a coating material thereupon;

c. extending the filament through the metallic pipe and adjacent the interior surface of the metallic pipe in a vacuum;

d. resistively heating the filament to a temperature sufficient to transfer the coating material from the filament to the interior surface of the metallic pipe, wherein the metallic pipe is electrically isolated from the filament while the filament is being resistively heated; and e. heating the metallic pipe to a temperature sufficient to form a diffusion coating formed of the metallic pipe and the coating material on the interior surface of the metallic pipe.

15. The method of claim 14 wherein the step of transferring the coating material is selected from the group consisting of sublimating the coating material, evaporating the coating material, and combinations thereof.

16. The method of claim 14 wherein the step of heating the metallic pipe is provided by radiant heating from the filament.

17. The method of claim 14 wherein the step of heating the metallic pipe is provided by resistive heating from a power source electrically isolated from the filament.

18. The method of claim 14 wherein the metallic pipe is selected from the group consisting of steel, stainless steel, aluminum alloy, and zirconium alloy.

19. The method of claim 14 wherein the filament is selected from the group consisting of tungsten filament and molybdenum filament.

20. The method of claim 14 wherein the coating material is selected from the group consisting of Ag, Al, As, Au, Ba, Be, Bi, Ca, Cd, Co, Cr, Cu, Dy, Er, Eu, Fe, Ga, Ge, Hg, In, K, Li, Mg, Mn, Na, Ni, P, Pb, Pd, Pr, S, Sb, Sc, Se, Si, Sn, Sr, Te, Tl, Y, Yb, Zn, and combinations thereof.

21. The method of claim 14 wherein the step of extending the filament through the metallic pipe and adjacent to the interior surface of the object is provided by tensioning the filament.

22. The method of claim 21 wherein the step of tensioning the filament is provided by attaching at least one end of the filament to a spring.

23. The method of claim 14 wherein the step of electrically isolating the metallic pipe is provided by providing non-conducting guides juxtaposed between the metallic pipe and the filament.

24. The method of claim 23 wherein the non-conducting guides juxtaposed between the metallic pipe and the filament are ceramic materials.

25. The method of claim 14 wherein the vacuum is maintained at about $10^{-4}$ Torr.

26. The method of claim 14 wherein the vacuum contains a partial pressure of a gas selected from the group consisting of nitrogen, hydrogen, or hydrocarbon, or combinations thereof.

27. A method for forming a diffusion coating on the interior surface of a metallic pipe comprising the steps of:

a. providing a metallic pipe having an interior diameter less than 6 inches and an aspect ratio of length to diameter of greater than or equal to 2 to 1;

b. providing a filament having a coating material thereupon;

c. extending the filament through the metallic pipe and adjacent to the interior surface of the metallic pipe in a vacuum;

d. resistively heating the filament to a temperature sufficient to transfer the coating material from the filament and to the interior surface of the metallic pipe, wherein the metallic pipe is electrically isolated from the filament while the filament is being resistively heated; and e. heating the metallic pipe to a temperature sufficient to form a diffusion coating formed of the metallic pipe and the coating material on the interior surface of the metallic pipe.

28. The method of claim 27 wherein the step of transferring the coating material is selected from the group consisting of sublimating the coating material, evaporating the coating material, and combinations thereof.

29. The method of claim 27 wherein the step of heating the metallic pipe is provided by radiant heating from the filament.

30. The method of claim 27 wherein the step of heating the metallic pipe is provided by resistive heating from a power source electrically isolated from the filament.

31. The method of claim 27 wherein the metallic pipe is selected from the group consisting of steel, stainless steel, aluminum alloy, and zirconium alloy.

32. The method of claim 27 wherein the filament is selected from the group consisting of tungsten filament and molybdenum filament.

33. The method of claim 27 wherein the coating material is selected from the group consisting of Ag, Al, As, Au, Ba, Be, Bi, Ca, Cd, Co, Cr, Cu, Dy, Er, Eu, Fe, Ga, Ge, Hg, In, K, Li, Mg, Mn, Na, Ni, P, Pb, Pd, Pr, S, Sb, Sc, Se, Si, Sn, Sr, Te, Tl, Y, Yb, Zn, and combinations thereof.

34. The method of claim 27 wherein the step of extending the filament through the metallic pipe and adjacent to the interior surface of the object is provided by tensioning the filament.

35. The method of claim 34 wherein the step of tensioning the filament is provided by attaching at least one end of the filament to a spring.

36. The method of claim 27 wherein the step of electrically isolating the metallic pipe is provided by providing non-conducting guides juxtaposed between the metallic pipe and the filament.

37. The method of claim 27 wherein the step of electrically isolating the metallic pipe is provided by providing nonconducting guides juxtaposed between the metallic pipe and the filament.

38. The method of claim 37 wherein the non-conducting guides juxtaposed between the metallic pipe and the filament are ceramic materials.

39. The method of claim 27 wherein the vacuum is maintained at about $10^{-4}$ Torr.

40. The method of claim 27 wherein the vacuum contains a partial pressure of a gas selected from the group consisting of nitrogen, hydrogen, or hydrocarbon, or combinations thereof.

* * * * *